US012517436B2

(12) United States Patent
Yamanaka

(10) Patent No.: US 12,517,436 B2
(45) Date of Patent: Jan. 6, 2026

(54) LASER APPARATUS AND METHOD FOR MANUFACTURING ELECTRONIC DEVICES

(71) Applicant: Gigaphoton Inc., Tochigi (JP)

(72) Inventor: Takuma Yamanaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 510 days.

(21) Appl. No.: 18/180,504

(22) Filed: Mar. 8, 2023

(65) Prior Publication Data

US 2023/0229088 A1    Jul. 20, 2023

Related U.S. Application Data

(63) Continuation of application No. PCT/JP2020/039540, filed on Oct. 21, 2020.

(51) Int. Cl.
   *G03F 7/20* (2006.01)
   *H01S 3/225* (2006.01)

(52) U.S. Cl.
   CPC ............ *G03F 7/2006* (2013.01); *G03F 7/201* (2013.01); *H01S 3/2251* (2013.01)

(58) Field of Classification Search
   CPC ...... H01S 5/02326; H01S 5/141; H01S 5/143; H01S 3/08004; H01S 3/08009; H01S 3/134; H01S 3/137; H01S 3/139; H01S 3/2251; G03F 7/2006; G03F 7/201; G03F 7/70025; G03F 7/70575
   See application file for complete search history.

(56) References Cited

U.S. PATENT DOCUMENTS

2002/0167975 A1    11/2002  Spangler et al.
2005/0220162 A1    10/2005  Nakamura
(Continued)

FOREIGN PATENT DOCUMENTS

JP    H05-275317 A    10/1993
JP    2003-023198 A    1/2003
(Continued)

OTHER PUBLICATIONS

International Search Report issued in PCT/JP2020/039540; mailed Dec. 28, 2020.
(Continued)

*Primary Examiner* — Deoram Persaud
(74) *Attorney, Agent, or Firm* — Studebaker Brackett PLLC

(57) ABSTRACT

A laser apparatus includes an oscillator, a rotary stage that supports an optical element, a grating, a first driving mechanism that changes the angle of incidence of pulse laser light to be incident on the grating by driving the rotary stage, a second driving mechanism that changes the angle of incidence of the pulse laser light to be incident on the grating by driving the rotary stage by a smaller amount, a wavelength monitor, and a processor that cyclically changes a target wavelength of the pulse laser light. The processor calculates the moving average of drive instruction values by which the second driving mechanism is driven, and when the moving average exceeds a threshold, the processor causes the second driving mechanism to return to an initial position, and drives the first driving mechanism to cancel a change in the angle of incidence caused by the returning operation.

20 Claims, 25 Drawing Sheets

(56) References Cited

U.S. PATENT DOCUMENTS

| | | | | |
|---|---|---|---|---|
| 2005/0265417 | A1* | 12/2005 | Fallon | H01S 3/225 |
| | | | | 372/55 |
| 2015/0168848 | A1* | 6/2015 | Tanaka | G03F 7/70483 |
| | | | | 438/16 |
| 2015/0355025 | A1* | 12/2015 | Duffey | G03F 7/70041 |
| | | | | 355/67 |
| 2015/0380893 | A1* | 12/2015 | Matsunaga | H01S 3/137 |
| | | | | 372/20 |
| 2018/0107123 | A1* | 4/2018 | Mason | G03F 7/70625 |
| 2021/0226411 | A1* | 7/2021 | Miura | H01S 3/225 |
| 2021/0226419 | A1* | 7/2021 | Sacher | H01S 5/141 |
| 2024/0413600 | A1* | 12/2024 | Kishimoto | H01S 3/10 |

FOREIGN PATENT DOCUMENTS

| | | |
|---|---|---|
| JP | 2003-051633 A | 2/2003 |
| JP | 2005-284125 A | 10/2005 |
| JP | 2006-073883 A | 3/2006 |
| JP | 2006-269628 A | 10/2006 |
| JP | 2010-212490 A | 9/2010 |

OTHER PUBLICATIONS

International Preliminary Report on Patentability and Written Opinion issued in PCT/JP2020/039540; issued Apr. 13, 2023.

An Office Action; mailed by the China National Intellectual Property Administration of the People's Republic of China on Sep. 14, 2024, which corresponds to Chinese Patent Application No. 202080103699.8 and is related to U.S. Appl. No. 18/180,504.

* cited by examiner

LASER APPARATUS AND METHOD FOR MANUFACTURING ELECTRONIC DEVICES

CROSS-REFERENCE TO RELATED APPLICATIONS

The present application is a continuation application of International Application No. PCT/JP2020/039540, filed on Oct. 21, 2020, the entire contents of which are hereby incorporated by reference.

BACKGROUND

1. Technical Field

The present disclosure relates to a laser apparatus and a method for manufacturing electronic devices.

2. Related Art

In recent years, a semiconductor exposure apparatus is required to improve the resolution thereof as semiconductor integrated circuits are increasingly miniaturized and highly integrated. To this end, reduction in the wavelength of the light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

Light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] JP2003-23198A

SUMMARY

A laser apparatus according to a viewpoint of the present disclosure includes an oscillator configured to output pulse laser light, an optical element disposed in an optical path of the pulse laser light, a rotary stage configured to support the optical element, a grating on which the pulse laser light is incident via the optical element and which is disposed so as to cause diffracted light having a wavelength according to an angle of incidence of the pulse laser light to return to the oscillator, a first driving mechanism configured to change the angle of incidence of the pulse laser light to be incident on the grating by driving the rotary stage to rotate the optical element, a second driving mechanism configured to change the angle of incidence of the pulse laser light to be incident on the grating by driving the rotary stage by a smaller amount than an amount driven by the first driving mechanism to rotate the optical element, a wavelength monitor configured to measure a center wavelength of the pulse laser light, and a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured to cause the second driving mechanism to return to an initial position, and drive the first driving mechanism to cancel a change in the angle of incidence caused by the return of the second driving mechanism to the initial position when the calculated moving average exceeds a threshold.

A method for manufacturing electronic devices according to another viewpoint of the present disclosure includes generating laser light by a laser apparatus including an oscillator configured to output pulse laser light, an optical element disposed in an optical path of the pulse laser light, a rotary stage configured to support the optical element, a grating on which the pulse laser light is incident via the optical element and which is disposed so as to cause diffracted light having a wavelength according to an angle of incidence of the pulse laser light to return to the oscillator, a first driving mechanism configured to change the angle of incidence of the pulse laser light to be incident on the grating by driving the rotary stage to rotate the optical element, a second driving mechanism configured to change the angle of incidence of the pulse laser light to be incident on the grating by driving the rotary stage by a smaller amount than an amount driven by the first driving mechanism to rotate the optical element, a wavelength monitor configured to measure a center wavelength of the pulse laser light, and a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured to cause the second driving mechanism to return to an initial position, and drive the first driving mechanism to cancel a change in the angle of incidence caused by the return of the second driving mechanism to the initial position when the calculated moving average exceeds a threshold; outputting the laser light to an exposure apparatus; and exposing a photosensitive substrate to the laser light in the exposure apparatus to manufacture electronic devices.

A laser apparatus according to another viewpoint of the present disclosure includes an oscillator configured to output pulse laser light, a first optical element disposed in an optical path of the pulse laser light, a first rotary stage configured to support the first optical element, a second optical element disposed in the optical path of the pulse laser light, a second rotary stage configured to support the second optical element, a grating on which the pulse laser light is incident via the first and second optical elements and which is disposed so as to cause diffracted light having a wavelength according to an angle of incidence of the pulse laser light to return to the oscillator, a first driving mechanism configured to change the angle of incidence of the pulse laser light to be incident on the grating by driving the first rotary stage to rotate the first optical element, a second driving mechanism configured to change the angle of incidence of the pulse laser light to be incident on the grating by driving the second rotary stage by a smaller amount than an amount driven by the first driving mechanism to rotate the second optical element, a wavelength monitor configured to measure a center wavelength of the pulse laser light, and a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured to cause the second driving mechanism to return to an initial position, and drive the first driving mechanism to cancel a change in the angle of incidence caused by the return of the second driving mechanism to the initial position when the calculated moving average exceeds a threshold.

A method for manufacturing electronic devices according to another viewpoint of the present disclosure includes generating laser light by a laser apparatus including an oscillator configured to output pulse laser light, a first optical element disposed in an optical path of the pulse laser light, a first rotary stage configured to support the first optical element, a second optical element disposed in the optical path of the pulse laser light, a second rotary stage configured to support the second optical element, a grating on which the pulse laser light is incident via the first and second optical elements and which is disposed so as to cause diffracted light having a wavelength according to an angle of incidence of the pulse laser light to return to the oscillator, a first driving mechanism configured to change the angle of incidence of the pulse laser light to be incident on the grating by driving the first rotary stage to rotate the first optical element, a second driving mechanism configured to change the angle of incidence of the pulse laser light to be incident on the grating by driving the second rotary stage by a smaller amount than an amount driven by the first driving mechanism to rotate the second optical element, a wavelength monitor configured to measure a center wavelength of the pulse laser light, and a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured to cause the second driving mechanism to return to an initial position, and drive the first driving mechanism to cancel a change in the angle of incidence caused by the return of the second driving mechanism to the initial position when the calculated moving average exceeds a threshold; outputting the laser light to an exposure apparatus; and exposing a photosensitive substrate to the laser light in the exposure apparatus to manufacture electronic devices.

BRIEF DESCRIPTION OF THE DRAWINGS

Embodiments of the present disclosure will be described below only by way of example with reference to the accompanying drawings.

DETAILED DESCRIPTION

Contents

Figure 1:
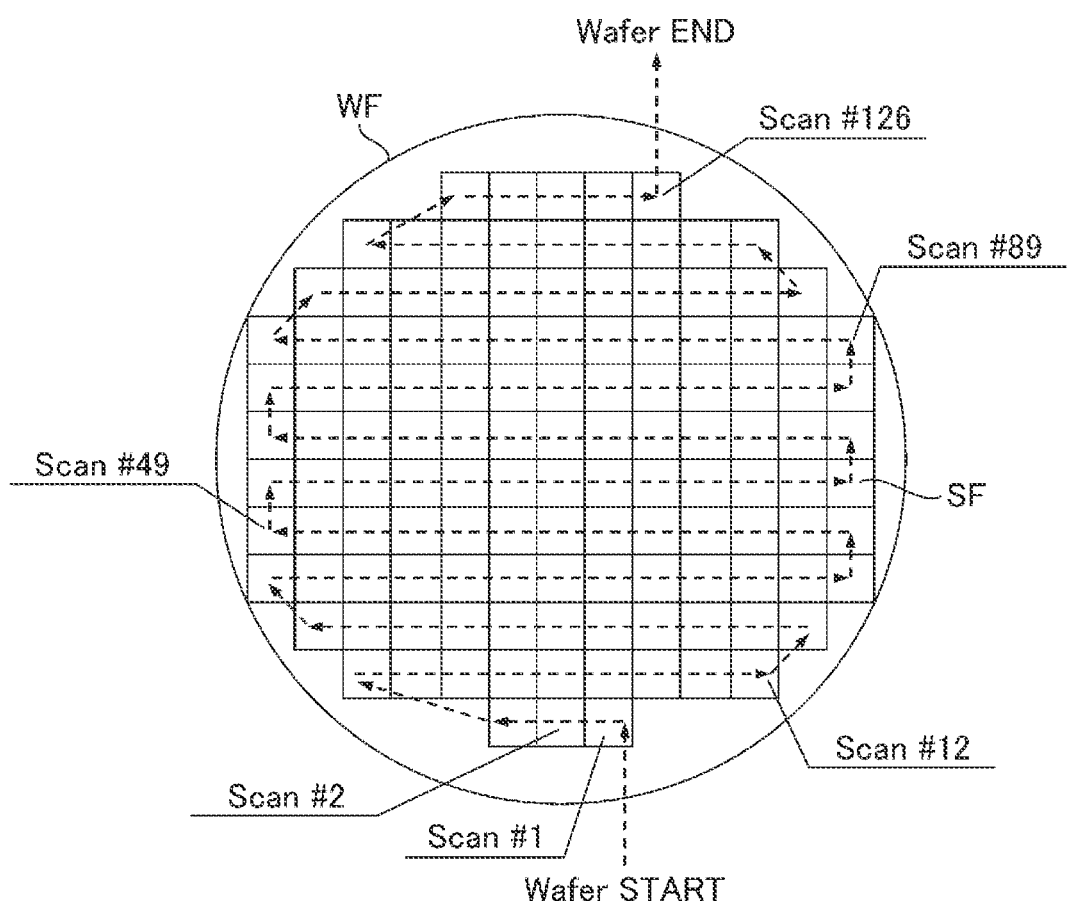
FIG. 1 shows an example of an exposure pattern in step-and-scan exposure on a wafer.

1. Description of terms
1.1 Description of N slit
1.2 Description of burst pulses
1.3 Other terms
2. Summary of excimer laser apparatus according to Comparative Example
2.1 Configuration
2.2 Operation
2.3 Problems
3. First Embodiment
3.1 Configuration
3.2 Operation
3.3 Description of flowchart showing control example
3.4 Effects and advantages
4. Second Embodiment
4.1 Configuration
4.2 Operation
4.3 Effects and advantages
5. Third Embodiment
5.1 Configuration
5.2 Operation
5.3 Example of hysteresis correction control
5.4 Example of control of a series of operations including tuning oscillation and actual exposure
5.5 Effects and advantages
6. Fourth Embodiment
6.1 Configuration
6.2 Operation
6.3 Effects and advantages
7. Fifth Embodiment
7.1 Configuration
7.2 Operation
7.3 Effects and advantages
8. Method for manufacturing electronic devices
9. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Terms

1.1 Description of N Slit

FIG. 1 shows an example of an exposure pattern in step-and-scan exposure on a wafer WF. A large number of rectangular regions shown within the wafer WF in FIG. 1 are each a scan field SF. The scan field SF is an exposure region where single scan exposure is performed and is also called a scan region. The wafer exposure is performed by performing the scan exposure on a plurality of exposure regions (scan fields) into which the wafer WF is divided and which each have a predetermined size during the period between the start (Wafer START) and end (Wafer END) of the wafer exposure, as shown in FIG. 1.

That is, the wafer exposure is performed by repeating the step of exposing a first predetermined exposure region of the wafer WF in first scan exposure (Scan #1) and then exposing a second predetermined exposure region in second scan exposure (Scan #2). During single scan exposure, pulse laser light can be continuously outputted multiple times from a laser apparatus. The scan exposure described above is successively repeated, and when the scan exposure of all the exposure regions of a first wafer WF is completed, tuning oscillation is performed again, and the wafer exposure of a second wafer WF is performed.

The step-and-scan exposure is performed in the order indicated by the broken-line arrows shown in FIG. 1, Wafer START→Scan #1→Scan #2→ . . . →Scan #126→Wafer END. The wafer WF is an example of a semiconductor substrate (photosensitive substrate) onto which a photoresist has been applied.

Figure 2:
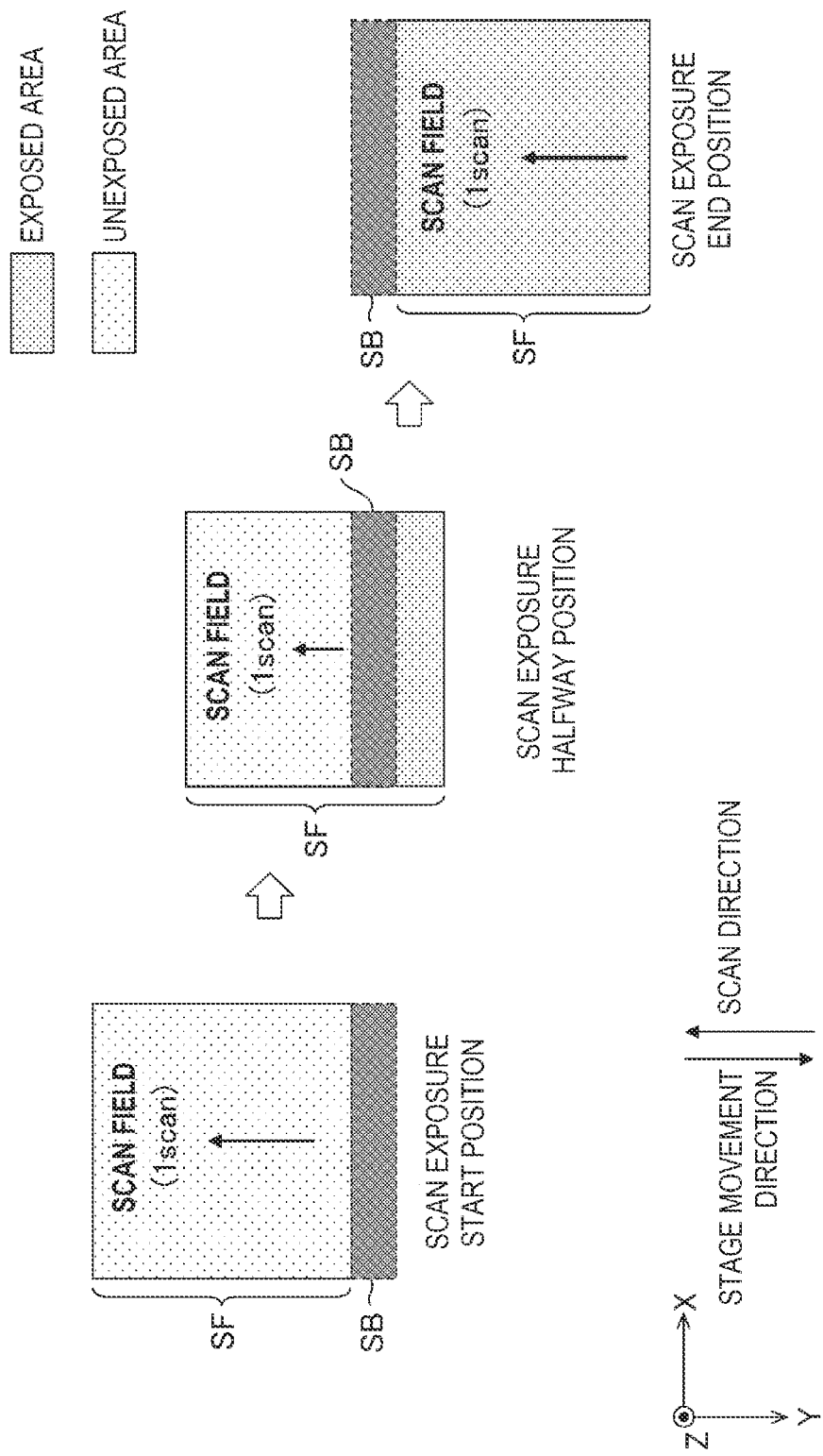
FIG. 2 shows the relationship between one scan field and a scan beam on the wafer.

FIG. 2 shows the relationship between one scan field SF and a scan beam SB on the wafer WF. The scan beam SB is a generally rectangular beam irradiation region where the light intensity distribution is substantially uniform and which is used in the scan exposure performed on the scan field SF. A reticle is irradiated with a generally rectangular, substantially uniform beam shaped by an illumination optical system, and the exposure is performed with the reticle and the wafer WF moved along the minor axis of the beam (axis-Y direction in the description) in opposite directions of the axis Y in accordance with the reduction magnification of a projection optical system. The scan fields SF of the wafer WF are thus each scanned and exposed with the reticle pattern.

In FIG. 2, the vertically upward direction toward the negative side of the axis-Y direction is a scan direction, and the direction toward the positive side of the axis-Y direction is a wafer movement direction (stage movement direction). The direction parallel to the plane of view of FIG. 2 and perpendicular to the axis-Y direction (axis-X direction) is called a scan width direction. The size of each of the scan fields SF of the wafer WF is, for example, 33 mm in the axis-Y direction and 26 mm in the axis-X direction.

Figure 3:
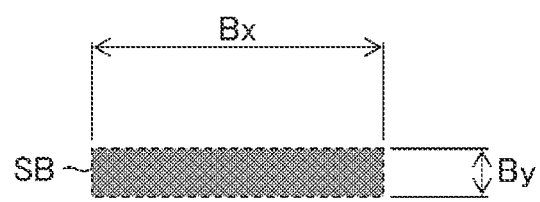
FIG. 3 shows an example of the area exposed to a scan beam.

FIG. 3 shows an example of the area irradiated with the scan beam SB. Let Bx be the length of the scan beam SB in the axis-X direction, and By be the width of the scan beam SB in the axis-Y direction, and Bx corresponds to the size of the scan field SF in the axis-X direction, and By is sufficiently smaller than the size of the scan field SF in the axis-Y direction.

The scan beam SB is an area irradiated with one pulse of the pulse laser light and is called an N slit. The number of pulses radiated during the scan exposure per location on the wafer WF is called the number of N slit pulses $N_{SL}$. The number of N slit pulses $N_{SL}$ is expressed by the expression below.

$$N_{SL}=(By/Vy) \cdot f$$

Vy: Wafer scan speed in axis-Y direction
f: Laser repetition frequency (Hz)

To expose the same scan field SF by using a plurality of wavelengths, the wavelength needs to be changed within the N slit in one cycle corresponding to the number of N slit pulses $N_{SL}$

1.2 Description of Burst Pulses

Figure 4:
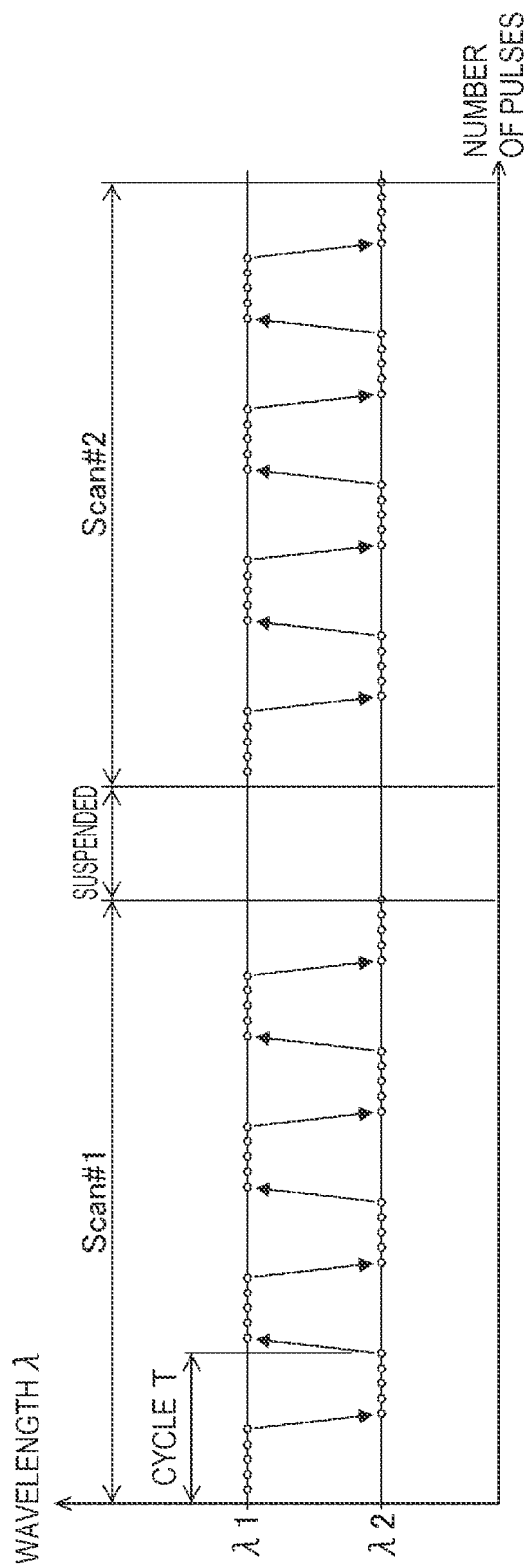
FIG. 4 is a graph illustrating an example of burst pulses.

FIG. 4 is a graph illustrating an example of burst pulses. The horizontal axis represents the number of pulses, and the vertical axis represents the wavelength. In the exposure of the wafer WF, when the scan exposure performed on one scan field SF is completed, the pulse generation is suspended, and the stage is driven and moved to the next scan field SF, followed by the scan exposure. In this case, the pulses have a waveform in which a series of pulses radiated at regular intervals alternate with a suspended period, as shown in FIG. 4. Pulses of this form are called burst pulses.

FIG. 4 shows an example in which the same scan field SF is exposed by using two wavelengths (wavelengths λ1 and λ2). FIG. 4 shows a case where the number of N slit pulses $N_{SL}$ is 10 by way of example, and the following description will be made with reference to a case where one cycle or a cycle T contains 10 pulses, with the first 5 pulses having a target wavelength λ1, the second 5 pulses having a target wavelength λ2. It is, however, noted that the number of N slit pulses $N_{SL}$ as the cycle T, the timing at which the two wavelengths are switched from one to the other, and the number of pulses required to expose the scan field SF are not limited to those in the example shown in FIG. 4. For example, the number of N slit pulses $N_{SL}$ may be 30.

1.3 Other Terms

The term "piezoelectric element" is in some cases simply referred to as a "piezo-element".

The term "parallel" in the present specification may include the concept of approximately parallel, which may be regarded as substantially parallel in a technical sense. The terms "vertical" or "perpendicular" in the present specification may include the concept of approximately vertical or approximately perpendicular, which may be regarded as substantially vertical or perpendicular in a technical sense.

2. Summary of Excimer Laser Apparatus According to Comparative Example

2.1 Configuration

Figure 5:
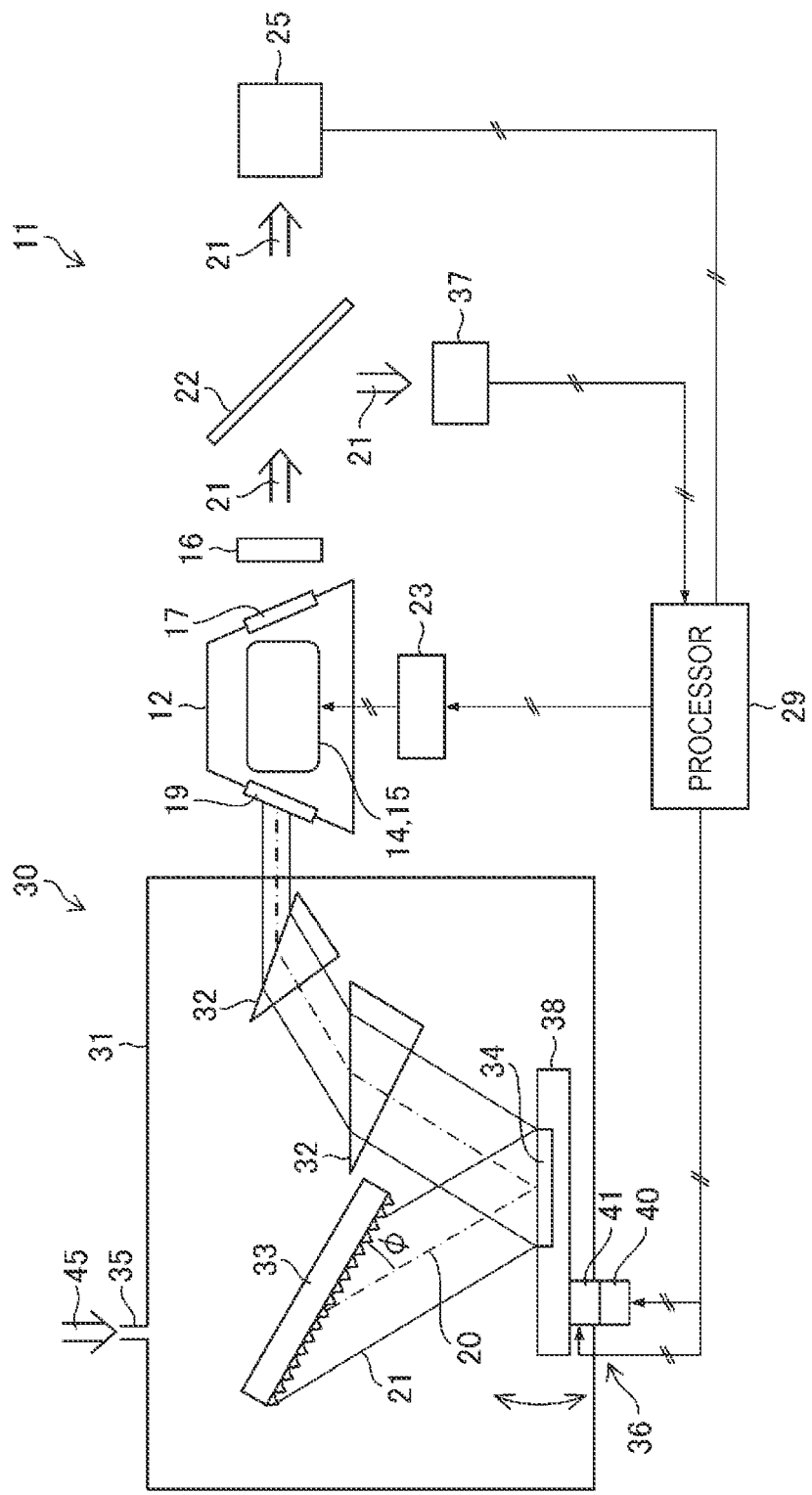
FIG. 5 schematically shows the configuration of an excimer laser apparatus according to Comparative Example.

FIG. 5 schematically shows the configuration of an excimer laser apparatus 11 according to Comparative Example. Comparative Example in the present disclosure is an aspect that the applicant is aware of as known only by the applicant, and is not a publicly known example that the applicant is self-aware of. The excimer laser apparatus 11 includes a laser chamber 12, which encapsulates a laser gas that is a laser medium. A front window 17 and a rear window 19, via which pulse laser light 21 passes, are disposed at opposite ends of the laser chamber 12 via holders that are not shown.

A pair of discharge electrodes 14 and 15 are disposed in the laser chamber 12 so as to face each other in the direction perpendicular to the plane of view of FIG. 5. A high voltage is applied from a high-voltage power supply 23 to the space between the discharge electrodes 14 and 15 to generate pulse discharge, which excites the laser gas to generate the pulse laser light 21, for example, at a frequency ranging from several kilohertz to a several tens of kilohertz.

The generated pulse laser light 21 travels, for example, to the rear of the laser chamber 12 (leftward in FIG. 5) and enters a line narrowing unit 30, which narrows the linewidth of the pulse laser light 21. The line narrowing unit 30 is surrounded by a line narrowing box 31, and accommodates prisms 32, 32, a wavelength selection mirror 34, a grating 33, and other optical elements.

The wall of the line narrowing box 31 is provided with a purge gas supply port 35. A low-reactivity purge gas 45, such as a clean, dry rare gas or high-purity nitrogen, is introduced into the line narrowing box 31 via the purge gas supply port 35.

The pulse laser light 21 having entered the line narrowing unit 30 is enlarged by the prisms 32, 32, reflected off the wavelength selection mirror 34, and incident on the grating 33, which is a line narrowing optical element. The grating 33 reflects, through diffraction, only the pulse laser light 21 having a center wavelength λc, which is determined by an angle of incidence φ. That is, the grating 33 is disposed in the Littrow arrangement, which causes the diffracted light having the center wavelength λc according to the angle of incidence φ, out of the pulse laser light 21 incident on the grating 33, to return to the laser chamber 12.

The wavelength selection mirror 34 is mounted on a movable holder 36, which is rotatable in a horizontal plane (plane parallel to plane of view of FIG. 5). Rotating the movable holder 36 to rotate the wavelength selection mirror 34 changes the angle of incidence φ, at which the pulse laser light 21 is incident on the grating 33. The center wavelength λc of the pulse laser light 21 to be diffracted by the grating 33 is thus changed. In FIG. 5, reference character 20 denotes the optical axis of the pulse laser light 21.

The narrowed-line pulse laser light 21 is amplified by the discharge between the discharge electrodes 14 and 15 while traveling back and forth several times between the grating 33 in the line narrowing unit 30 and a front mirror 16, which partially reflects the pulse laser light 21. The pulse laser light 21 then partially passes through the front mirror 16, exits forward (rightward in FIG. 5), and enters an exposure apparatus 25. Part of the pulse laser light 21 having exited out of the laser chamber 12 is extracted downward in FIG. 5 by a beam splitter 22, and the center wavelength λc of the pulse laser light 21 is monitored by a wavelength monitor 37.

Figure 6:
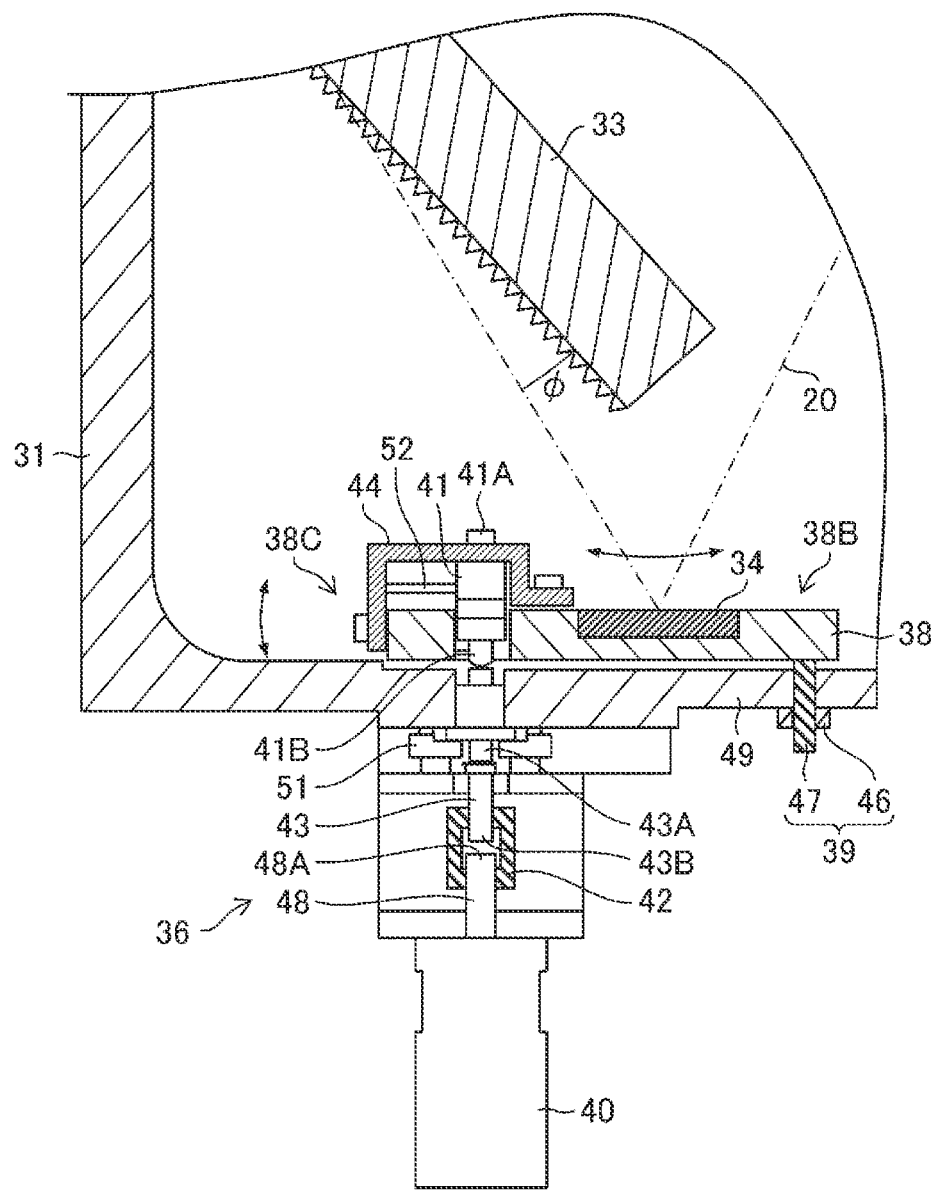
FIG. 6 is a plan cross-sectional view of a movable holder.
Figure 7:
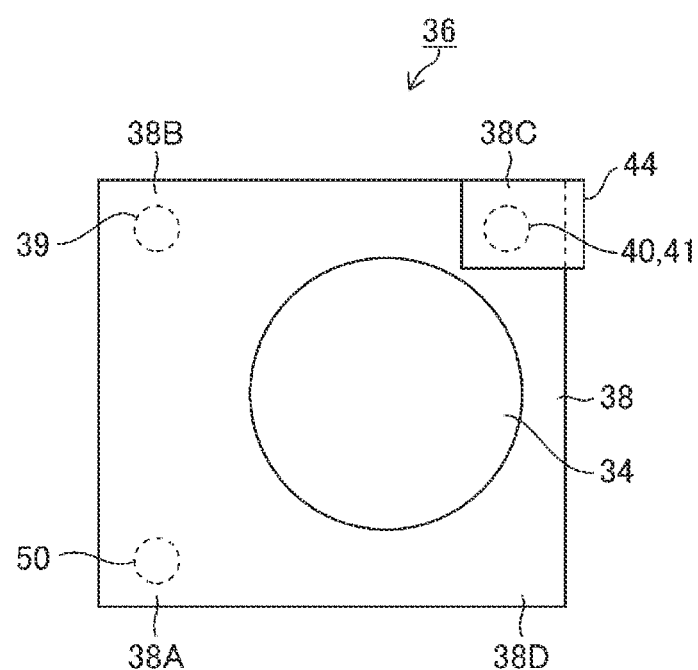
FIG. 7 is a front view of a movable holder viewed from the side facing a grating in a line narrowing box toward a wavelength selection mirror.

The structure of the movable holder 36 will be described below. FIG. 6 is a plan cross-sectional view of the movable holder 36. FIG. 7 is a front view of the movable holder 36 viewed from the side facing the grating 33 in the line narrowing box 31 toward the wavelength selection mirror 34. The movable holder 36 includes a rectangular mirror holder 38, to which the wavelength selection mirror 34 is fixed, as shown in FIGS. 6 and 7. The mirror holder 38 is attracted to the line narrowing box 31 by the urging force produced by an extension spring that is not shown and a plate spring 49.

Out of the four corners of the mirror holder 38, first to fourth corner sections 38A to 38D, the first corner section 38A and the second corner section 38B are pressed by the line narrowing box 31 via a manual micrometer 50 and a support member 39. The support member 39 has a configuration, for example, in which a screw 47 protrudes from the line narrowing box 31 by a predetermined length and is secured by a nut 46. The manual micrometer 50 is capable of manually changing an amount of protrusion thereof from the line narrowing box 31.

A piezoelectric element unit 41 is attached to the third corner section 38C of the mirror holder 38, as will be described later. The urging force produced by the extension spring, which is not shown, and the plate spring 49 causes a front end section 41B of the piezoelectric element unit 41 to come into contact with a ball screw unit 43 and press a stepper motor unit 40. The piezoelectric element unit 41 is a fine movement driving mechanism including a piezoelectric element. The stepper motor unit 40 is a coarse movement driving mechanism including a stepper motor.

The stepper motor unit 40 and the piezoelectric element unit 41 are both electrically connected to a processor 29, as shown in FIG. 5. The processor 29 functions as a laser controller that controls the entire excimer laser apparatus 11. The processor 29 in the present disclosure is a processing apparatus including a storage that stores a control program and a CPU (central processing unit) that executes the control program. The processor 29 is particularly configured or programmed to carry out a variety of processes contained in the present disclosure.

The stepper motor unit 40 rotates a motor shaft 48 (see FIG. 6) by a predetermined amount in accordance with the number of pulses that form a pulse signal received from the processor 29. A rear end section 43B of the ball screw unit 43 having precision-machined threads is attached to a front end section 48A of the motor shaft 48 via a coupling 42. The ball screw unit 43 performs smooth linear motion frontward or rearward along a guide 51 while rotating.

The front end section 43A of the ball screw unit 43 has been precision-machined into a surface perpendicular to the longitudinal direction thereof, and the front end section 41B, of the piezoelectric element unit 41, which has been precision-machined into a spherical surface, is in contact with the surface. Therefore, when the ball screw unit 43 moves frontward or rearward while rotating, the piezoelectric element unit 41 moves frontward or rearward without rotating. A rear end section 41A of the piezoelectric element unit 41 is fixed to a UV cover 44, which is fixed to the mirror holder 38.

Wiring 52 of the piezoelectric element unit 41 runs through the interior of the UV cover 44, exits out of the line narrowing box 31 via an introduction hole that is not shown, and is connected to the processor 29. The piezoelectric element unit 41 extends or contracts frontward or rearward by a length according to the magnitude of a voltage V applied via the wiring 52.

The position corresponding to about half the full stroke of the piezoelectric element unit 41 is called a neutral position. The voltage V that causes the piezoelectric element unit 41 to extend to the neutral position is called a neutral voltage V0. The processor 29 constantly applies the neutral voltage V0 to the piezoelectric element unit 41. The piezoelectric element unit 41 is thus kept at the neutral position as an initial position.

The processor 29 outputs a signal to the movable holder 36 to cause the stepper motor unit 40 or the piezoelectric element unit 41 to expand or contract, so that the third corner section 38C of the mirror holder 38 is pushed and pulled via the UV cover 44. The wavelength selection mirror 34 thus rotates to change the angle of incidence φ and hence change the center wavelength λc of the pulse laser light 21.

At this point, the processor 29 controls the wavelength of the pulse laser light 21 based on the center wavelength λc monitored by the wavelength monitor 37 in such a way that a wavelength deviation Δλ, which is the difference between the center wavelength λc and a target wavelength λ0, is smaller than a predetermined acceptable value. In the following description, the wavelength control that causes the wavelength deviation Δλ to be smaller than the predetermined acceptable value is referred to as causing the center wavelength λc to be equal to the target wavelength λ0.

The processor 29 also controls the output of the pulses of the pulse laser light 21 by outputting an instruction to the high-voltage power supply 23. Furthermore, the processor 29 communicates with the exposure apparatus 25, and instructs laser oscillation based on an oscillation instruction signal from the exposure apparatus 25. The processor 29 instead outputs the oscillation instruction signal based on its own determination in some cases to instruct the laser oscillation.

2.2 Operation

When a photoresist film is irradiated with the pulse laser light 21 in the exposure apparatus 25, it is known to expose the photoresist film by using a plurality of wavelengths to increase the depth of focus. Even when a thick photoresist film is exposed to the pulse laser light, a large depth of focus allows the imaging performance to be maintained in the thickness direction of the photoresist film.

How to perform exposure using a plurality of wavelengths, it is known to cyclically switch the wavelength of the pulse laser light 21 generated by the excimer laser apparatus 11 between two wavelengths, for example, a long wavelength and a short wavelength (See FIG. 4). The following is an example of the operation of setting the wavelengths λ1 and λ2 as the target wavelengths and cyclically switching the two wavelengths from one to the other.

[Step 1] The processor 29 receives from the exposure apparatus 25 the two target wavelengths λ1 and λ2 and the cycle T, over which the wavelengths are controlled. The cycle T is expressed in the number of pulses per cycle. The number of pulses representing the cycle T may be the number of pulses radiated to the same location on the photoresist film on the wafer WF, that is, the number of N slit pulses $N_{SL}$.

[Step 2] The processor 29 drives the piezoelectric element unit 41 or the stepper motor unit 40 to rotate the wavelength selection mirror 34 in such a way that the received target wavelength λ1 is achieved, so that the angle of incidence φ of the pulse laser light 21 to be incident on the grating 33 is changed.

[Step 3] Part of the narrowed-line pulse laser light 21 is extracted by the beam splitter 22, and the wavelength of the pulse laser light 21 is measured by the wavelength monitor 37.

[Step 4] When the measured wavelength (center wavelength λc) deviates from the target wavelength λ1, the processor 29 drives the piezoelectric element unit 41, which has an excellent fast response, to adjust the posture of the wavelength selection mirror 34 in such a way that the center wavelength λc approaches the target wavelength λ1. The feedback control in step 4 is performed on a pulse basis.

[Step 5] When the timing at which the wavelength is switched is reached, the processor 29 drives the piezoelectric element unit 41 to rotate the wavelength selection mirror 34 in such a way that the wavelength of the pulse laser light 21 is equal to the target wavelength λ2, so that the angle of incidence φ of the pulse laser light 21 to be incident on the grating 33 is changed.

[Step 6] Part of the pulse laser light 21 generated by the operation in step 5 is extracted by the beam splitter 22, and the wavelength of the pulse laser light 21 is measured by the wavelength monitor 37.

[Step 7] When the measured wavelength deviates from the target wavelength λ2, the processor 29 drives the piezoelectric element unit 41 to adjust the posture of the wavelength selection mirror 34 in such a way that the center wavelength λc approaches the target wavelength λ2. The feedback control in step 7 is also performed on a pulse basis.

[Step 8] When the timing at which the wavelength is switched is reached, the processor 29 drives the piezoelectric element unit 41 to rotate the wavelength selection mirror 34 in such a way that the target wavelength λ1 is achieved, so that the angle of incidence tri of the pulse laser light 21 to be incident on the grating 33 is changed.

Steps 3 to 8 described above are then repeated.

2.3 Problems

The piezoelectric element used in the line narrowing unit 30 is affected by temperature, so that the output from the piezoelectric element relative to input thereinto fluctuates (drifts) over time. Although a piezoelectric instruction is therefore corrected by feedback control on a pulse basis, the angle of the wavelength selection mirror 34 cannot be adjusted any further in some cases once the piezoelectric element reaches its operation limit.

It is therefore conceivable that when a piezoelectric instruction value reaches a predetermined threshold, the stepper motor is driven to adjust the posture of the wavelength selection mirror 34 to cause the piezoelectric element to return to the neutral position.

Figure 8:
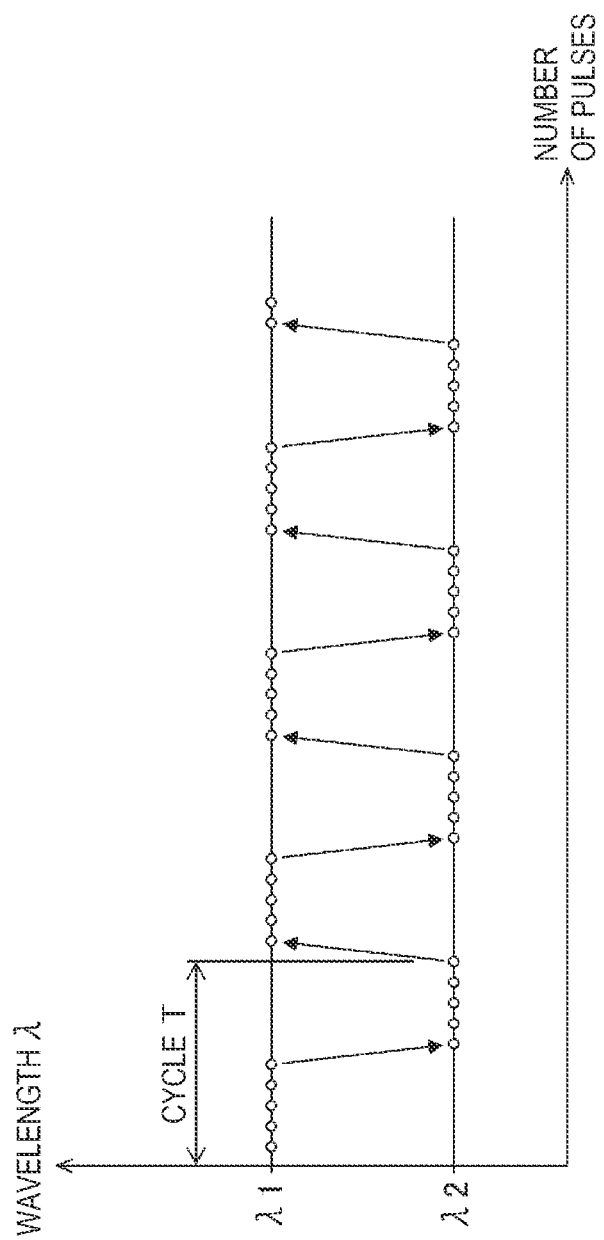
FIG. 8 shows an example of the burst pulses that switch two wavelengths from one to the other.
Figure 9:
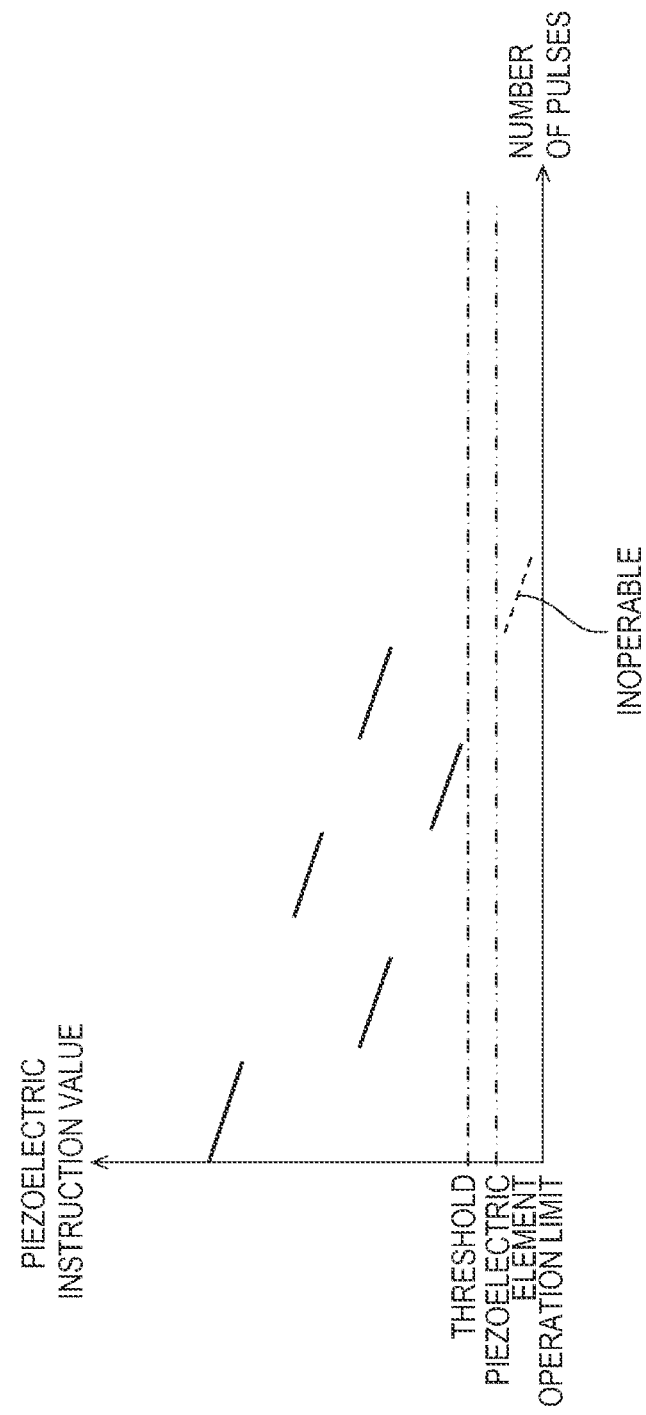
FIG. 9 shows an example of a piezoelectric instruction corresponding to the two-wavelength switching control shown in FIG. 8.

When the target wavelength is switched from λ1 to λ2, however, the piezoelectric instruction value has already exceeded the threshold and the operation limit and may be inoperable, as shown in FIGS. 8 and 9.

FIG. 8 shows an example of the burst pulses that switch the two wavelengths from one to the other. The horizontal axis represents the number of pulses, and the vertical axis represents the wavelength. FIG. 8 shows the case where the cycle T contains 10 pulses, with the first 5 pulses having the target wavelength λ1, the second 5 pulses having the target wavelength λ2, as in FIG. 4. FIG. 9 shows an example of the piezoelectric instruction corresponding to the two-wavelength switching control shown in FIG. 8. The horizontal axis represents the number of pulses, and the vertical axis represents the piezoelectric instruction value. The horizontal axis in FIG. 9 shows the same range of the number of pulses as that shown by the horizontal axis in FIG. 8 on the same scale. The piezoelectric instruction changes discontinuously as shown in FIG. 9 in correspondence with the discontinuous changes in the target wavelength between the two wavelengths, λ1 and λ2, as shown in FIG. 8.

In FIG. 9, obliquely rightward and downward change in the piezoelectric instruction value is caused by a drift component due to the effect of the temperature of the piezoelectric element. The output from the piezoelectric element in response to an instruction drifts under the effect of the temperature. The processor 29 performs the feedback control to correct the piezoelectric element instruction value based on the difference between the measured center wavelength, which reflects the operation of driving the piezoelectric element, and the target wavelength, so that the piezoelectric instruction value changes obliquely, as shown in FIG. 9.

In FIG. 9, the single-dotted line represents the threshold for controlling the operation of driving the stepper motor, and the double-dotted line represents the operation limit of the piezoelectric element. The threshold specifies the lower limit of the instruction value, and the piezoelectric element can operate normally until the end of the piezoelectric instruction for the long wavelength in the third cycle because the instruction value does not reach the threshold in FIG. 9. When the piezoelectric instruction for the long wavelength is switched to that for the short wavelength in the third cycle, however, the piezoelectric element becomes inoperable because the piezoelectric instruction value exceeds the piezoelectric operation limit, as indicated by the broken line in FIG. 9.

3. First Embodiment

3.1 Configuration

The configuration of the laser apparatus according to a first embodiment may be the same as that of the excimer laser apparatus 11 shown in FIGS. 5 to 7.

3.2 Operation

The laser apparatus according to the first embodiment differs from the laser apparatus according to Comparative Example in terms of operation including the control performed by the processor 29. The operation of the laser apparatus according to the first embodiment will be described below in terms of points different from those in Comparative Example.

Figure 10:
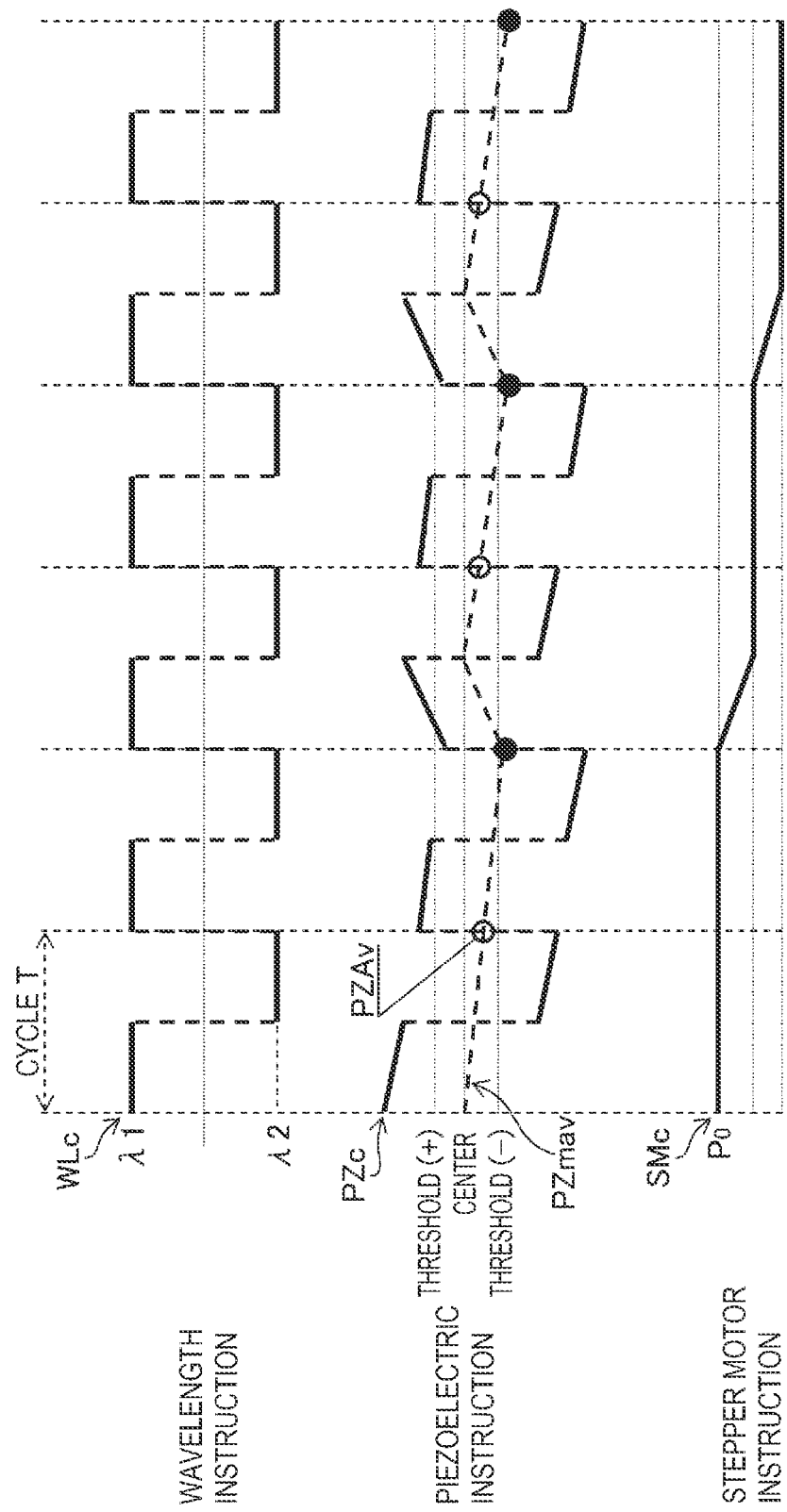
FIG. 10 is a timing chart showing an example of the operation of a laser apparatus according to a first embodiment.

FIG. 10 is a timing chart showing an example of the operation of the laser apparatus according to the first embodiment. The horizontal axis may be taken as the time or the number of pulses. The upper portion of FIG. 10 shows a waveform WLc of a wavelength instruction, the middle portion shows a waveform PZc of the piezoelectric instruction given to the piezoelectric element, and the lower portion shows a waveform SMc of a stepper motor instruction given to the stepper motor.

The waveform WLc of the wavelength instruction alternates between the instruction of switching to the wavelength λ1 and the instruction of switching to the wavelength λ2 within the cycle T. FIG. 10 shows the waveform WLc of the wavelength instruction in the form of a rectangular wave, but the actual wavelength instruction is a discrete waveform that instructs the target wavelength on a pulse basis. That is, the processor 29 changes wavelength instructions each containing a plurality of consecutive pulses that instruct the target wavelength λ1 and wavelength instructions each containing a plurality of consecutive pulses that instruct the target wavelength λ2 into a rectangular-wave wavelength instruction. The wavelength λ1 is an example of the "first wavelength" in the present disclosure. The wavelength λ2 is an example of the "second wavelength" in the present disclosure. The cycle T, over which the wavelength instruction is cyclically changed, is called a wavelength instruction cycle.

The waveform PZc of the piezoelectric instruction has an instruction value that greatly changes as the wavelength instruction switches between the wavelength λ1 and the wavelength λ2. The piezoelectric instruction has a first threshold and a second threshold set therein. The first threshold is a threshold that specifies the lower limit of the piezoelectric instruction value and is denoted as a "threshold (−)" in FIG. 10. The second threshold is a threshold that specifies the upper limit of the piezoelectric instruction value and is denoted as a "threshold (+)" in FIG. 10. The "center" shown between the threshold (−) and the threshold (+) represents an instruction value that instructs the neutral position.

The processor 29 performs the feedback control on the piezoelectric instruction on a pulse basis during the period of the wavelength instruction that instructs the wavelength λ1 or during the period of the wavelength instruction that instructs the wavelength λ2 to compensate for the effect of the temperature of the piezoelectric element. The feedback control corrects the piezoelectric instruction based on the difference between the center wavelength measured by the wavelength monitor 37 and the target wavelength.

The processor 29 calculates the moving average of the piezoelectric instruction values over a segment that is an integer multiple of the rectangular-wave wavelength instruction cycle, and drives the stepper motor to correct the drift of the piezoelectric instruction when a piezoelectric instruction moving average PZmav derived by the moving average operation exceeds the thresholds. For example, the segment over which the moving average of the piezoelectric instruction values is calculated may be one wavelength instruction cycle, that is, the cycle T.

In FIG. 10, the piezoelectric instruction moving average PZmav is drawn with the broken line. The white and black circles shown on the graph of the piezoelectric instruction moving average PZmav each represent a moving average PZAv calculated for each cycle T, with the white circles indicating that the average does not exceed the thresholds, the black circles indicating that the average exceeds the thresholds. Note that "does not exceed the thresholds" in the description means that the average falls within an acceptable range specified by the first and second thresholds. Also note that "exceeds the thresholds" in the description means that the average is out of the acceptable range specified by the first and second thresholds. At the timing when the moving average PZAv indicated by each of the black circles in FIG. 10 is obtained, the stepper motor driving instruction is changed, and the piezoelectric instruction is changed accordingly.

Since the moving average calculation segment is the cycle T, a first moving average is calculated at the end of the first wavelength instruction cycle. Thereafter, the moving average is calculated in a time-series manner. In FIG. 10, in which the moving average exceeds the thresholds at each of the black circles, the stepper motor is driven to cause the piezoelectric element to return to its initial position (neutral position). The piezoelectric element drift component can thus be corrected by driving the stepper motor even when the wavelength is greatly changed between the two wavelengths, the long wavelength (λ1) and the short wavelength (λ2).

FIG. 10 shows the case where the operation of driving the stepper motor starts at a timing that is an integer multiple of the wavelength instruction cycle, and a stepper motor (STM) correction execution timing, which is the timing at which the stepper motor is driven to make the correction, may not be a timing that is an integer multiple of the wavelength instruction cycle.

Driving the stepper motor based on the comparison of the piezoelectric instruction moving average PZmav with the first and second thresholds and correcting a piezoelectric instruction drift is called "piezoelectric drift correction". In the piezoelectric drift correction performed by the laser apparatus according to the first embodiment, when the piezoelectric instruction moving average PZmav calculated over a segment that is an integer multiple of the wavelength instruction cycle exceeds the thresholds, the piezoelectric element is caused to return to the neutral position (initial position), and the stepper motor is driven to cancel the change in the angle of incidence φ of the light to be incident on the grating 33 due to the operation of causing the piezoelectric element to return to the neutral position.

The processor 29 determines the moving average of the piezoelectric instruction values over a segment that is an integer multiple of the wavelength instruction cycle and can therefore properly detect the piezoelectric element drift component separately from the component of the change in the piezoelectric instruction value for the wavelength change. In the example shown in FIG. 10, when the moving average PZAv is smaller than the threshold (−), the length of the stepper motor unit 40 is reduced from an initial length P0. The amount of reduction in this process may be substantially equal to the amount by which the piezoelectric element is driven to reduce the length thereof from that corresponding to the neutral voltage V0 to that corresponding to the threshold (−).

The wavelength selection mirror 34 is an example of the "optical element" in the present disclosure. The movable holder 36, which rotates the mirror holder 38, is an example of the "rotary stage" in the present disclosure. The stepper motor unit 40, which includes a stepper motor, is a mechanism that coarsely changes the angle of incidence φ of the light to be incident on the grating 33 and is an example of the "first driving mechanism" in the present disclosure. The piezoelectric element unit 41, which includes a piezoelectric element, is a mechanism that drives the mirror holder 38 by an amount smaller than the amount by which the stepper motor is driven to finely change the angle of incidence φ of the light to be incident on the grating 33, and is an example of the "second driving mechanism" in the present disclosure. The piezoelectric instruction is an example of the "drive instruction" in the present disclosure, and the piezoelectric instruction value is an example of the "drive instruction value" in the present disclosure. The laser chamber 12 is an example of the "oscillator" in the present disclosure.

3.3 Description of Flowchart Showing Control Example

Figure 11:
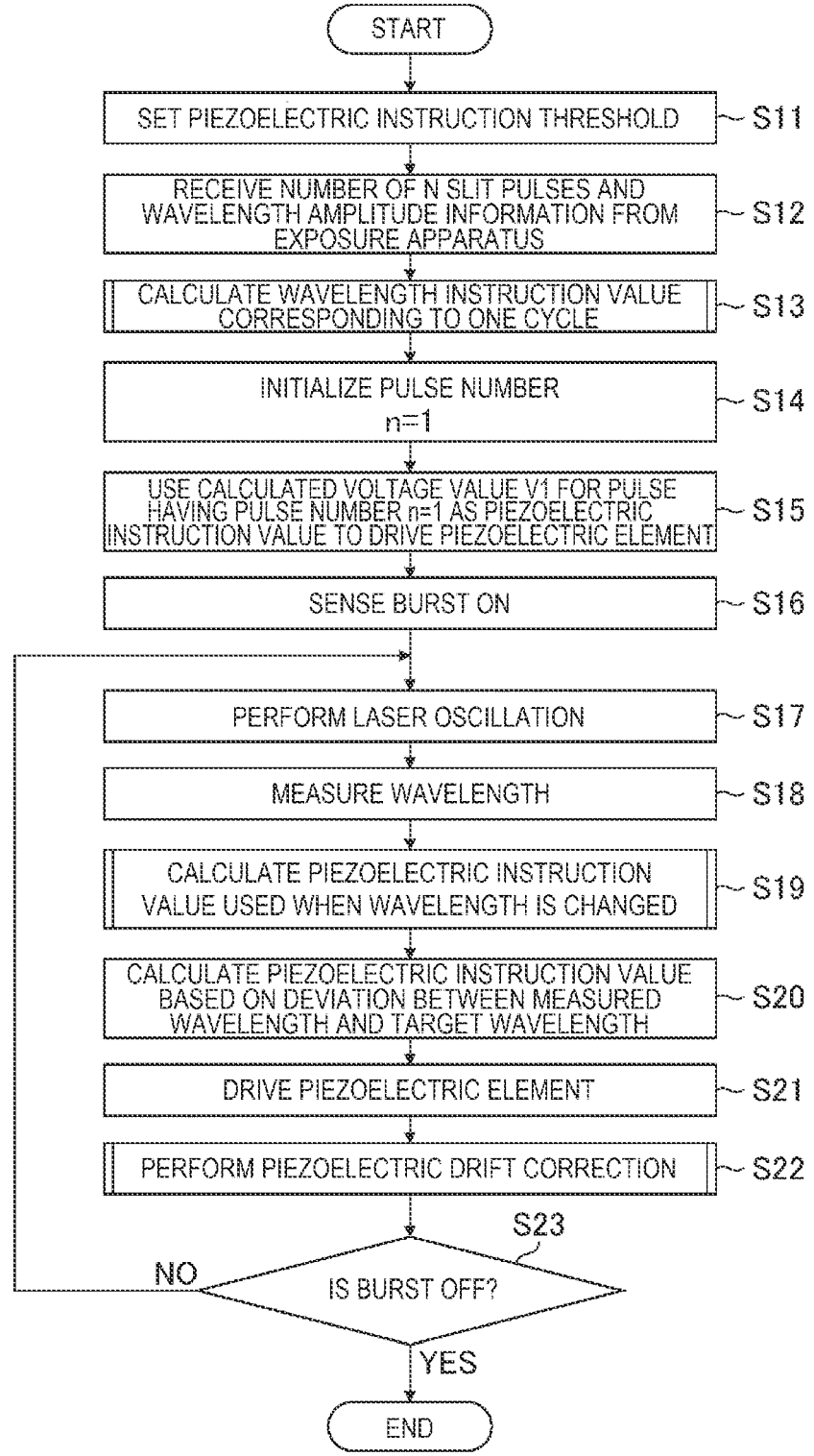
FIG. 11 is a flowchart showing an example of control performed by the laser apparatus according to the first embodiment.

FIG. 11 is a flowchart showing an example of the control performed by the laser apparatus according to the first embodiment. In step S11, the processor 29 sets a threshold of the piezoelectric instruction value. The threshold includes the first and second thresholds described with reference to FIG. 10.

Thereafter, in step S12, the processor 29 receives from the exposure apparatus 25 the number of N slit pulses $N_{SL}$ and wavelength amplitude information.

Thereafter, in step S13, the processor 29 calculates a wavelength instruction value corresponding to one cycle T. The wavelength instruction corresponding to one cycle T is not limited to the rectangular wave illustrated in FIG. 10, but may be a triangular wave, a sinusoidal wave, or any other wave.

Thereafter, in step S14, the processor 29 initializes the value of a pulse number n to achieve n=1.

Thereafter, in step S15, the processor 29 uses a calculated voltage value V1 for the pulse having the pulse number n=1 as the piezoelectric instruction value to drive the piezoelectric element.

Thereafter, in step S16, the processor 29 senses a burst signal instructed by the exposure apparatus 25.

Thereafter, in step S17, the processor 29 applies the high voltage to the space between the discharge electrodes 14 and 15 of the laser chamber 12 to generate discharge for the laser oscillation.

Thereafter, in step S18, the processor 29 measures the wavelength of the pulse laser light with the wavelength monitor 37.

Thereafter, in step S19, the processor 29 calculates a piezoelectric instruction value used when the wavelength is changed.

Thereafter, in step S20, the processor 29 calculates a piezoelectric instruction value based on deviation between the wavelength measured in step S18 and the target wavelength.

Thereafter, in step S21, the processor 29 drives the piezoelectric element in accordance with the piezoelectric instruction value calculated in step S20.

Thereafter, in step S22, the processor 29 performs the piezoelectric drift correction.

Thereafter, in step S23, the processor 29 evaluates whether the burst signal is OFF. When the burst signal instructed by the exposure apparatus 25 is ON, and the result of the evaluation in step S23 is NO, the processor 29 returns to step S17.

On the other hand, when the result of the evaluation in step S23 is YES, the processor 29 terminates the flowchart of FIG. 11.

Figure 12:
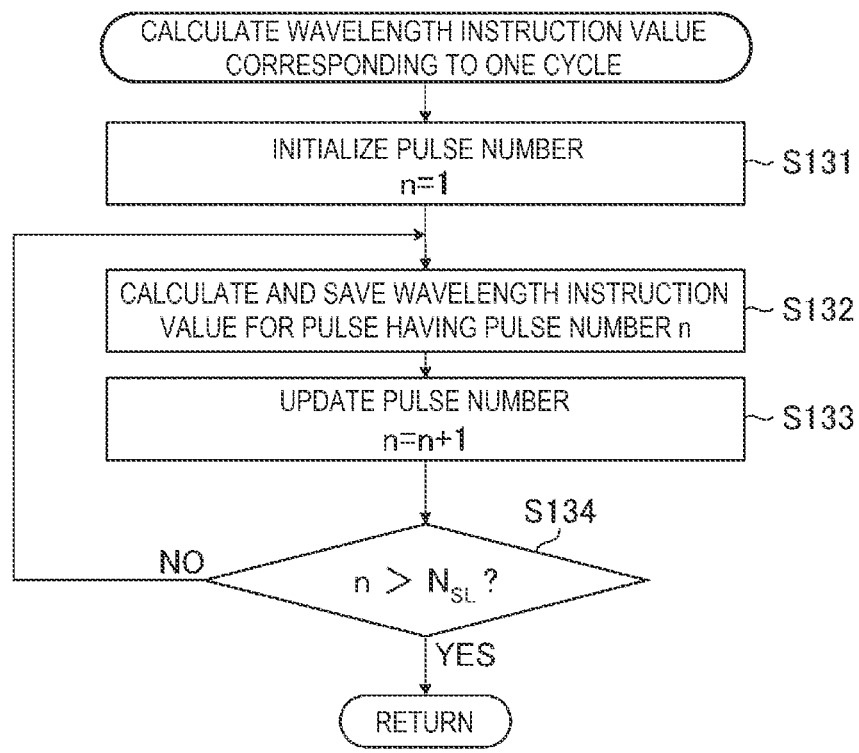
FIG. 12 is a flowchart showing an example of a subroutine applied to step S13 in FIG. 11.

FIG. 12 is a flowchart showing an example of a subroutine applied to step S13 in FIG. 11. In step S131, the processor 29 initializes the pulse number n to achieve n=1.

Thereafter, in step S132, the processor 29 calculates and saves the wavelength instruction value for the pulse having the pulse number n.

Thereafter, in step S133, the processor 29 increments the pulse number n into n+1 and updates the pulse number in such a way that the value n+1 is the new value of the pulse number n.

Thereafter, in step S134, the processor 29 evaluates whether the pulse number n exceeds the number of N slit pulses $N_{SL}$, which is the number of pulses in one cycle T. That is, the processor 29 evaluates whether $n > N_{SL}$ is satisfied.

When the result of the evaluation in step S134 is NO, the processor 29 returns to step S132. On the other hand, when the result of the evaluation in step S134 is YES, the processor 29 terminates the flowchart of FIG. 12 and returns to the main procedure of FIG. 11.

Figure 13:
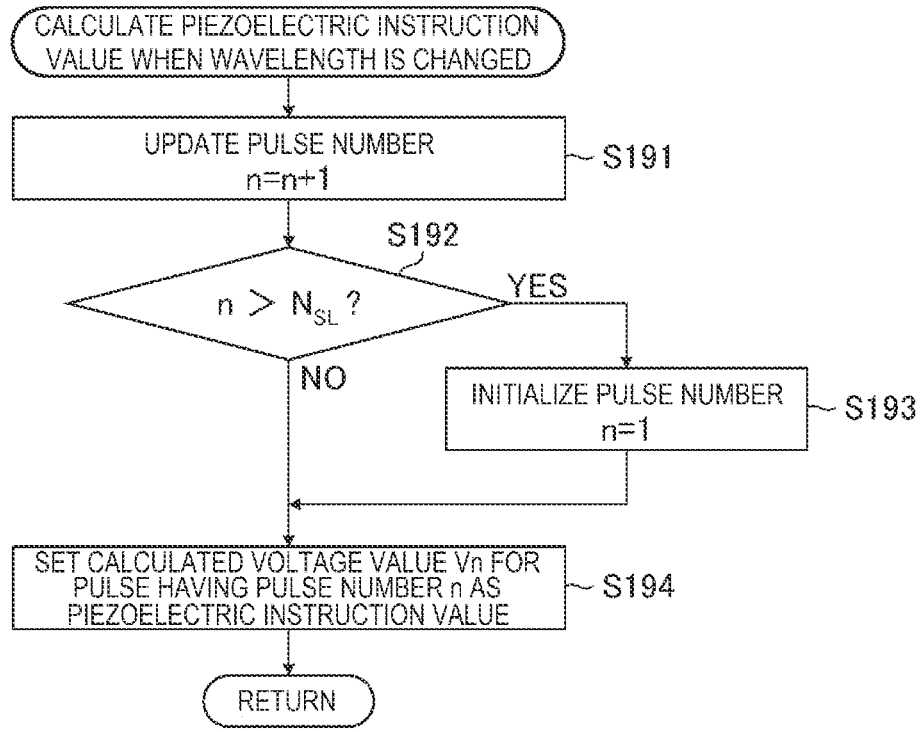
FIG. 13 is a flowchart showing an example of a subroutine applied to step S19 in FIG. 11.

FIG. 13 is a flowchart showing an example of a subroutine applied to step S19 in FIG. 11. In step S191, the processor 29 increments the pulse number n into n+1 and updates the pulse number in such a way that the value n+1 is the new value of the pulse number n.

Thereafter, in step S192, the processor 29 evaluates whether the pulse number n exceeds the number of pulses in one cycle T.

When the result of the evaluation in step S192 is NO, the processor 29 proceeds to step S194. In step S194, the processor 29 sets a calculated voltage value Vn for the pulse having the pulse number n as the piezoelectric instruction value.

On the other hand, when the result of the evaluation in step S192 is YES, the processor 29 proceeds to step S193. In step S193, the processor 29 initializes the pulse number n to achieve n=1. After step S193, the processor 29 proceeds to step S194.

After step S194, the processor 29 terminates the flowchart of FIG. 13 and returns to the main procedure of FIG. 11.

Figure 14:
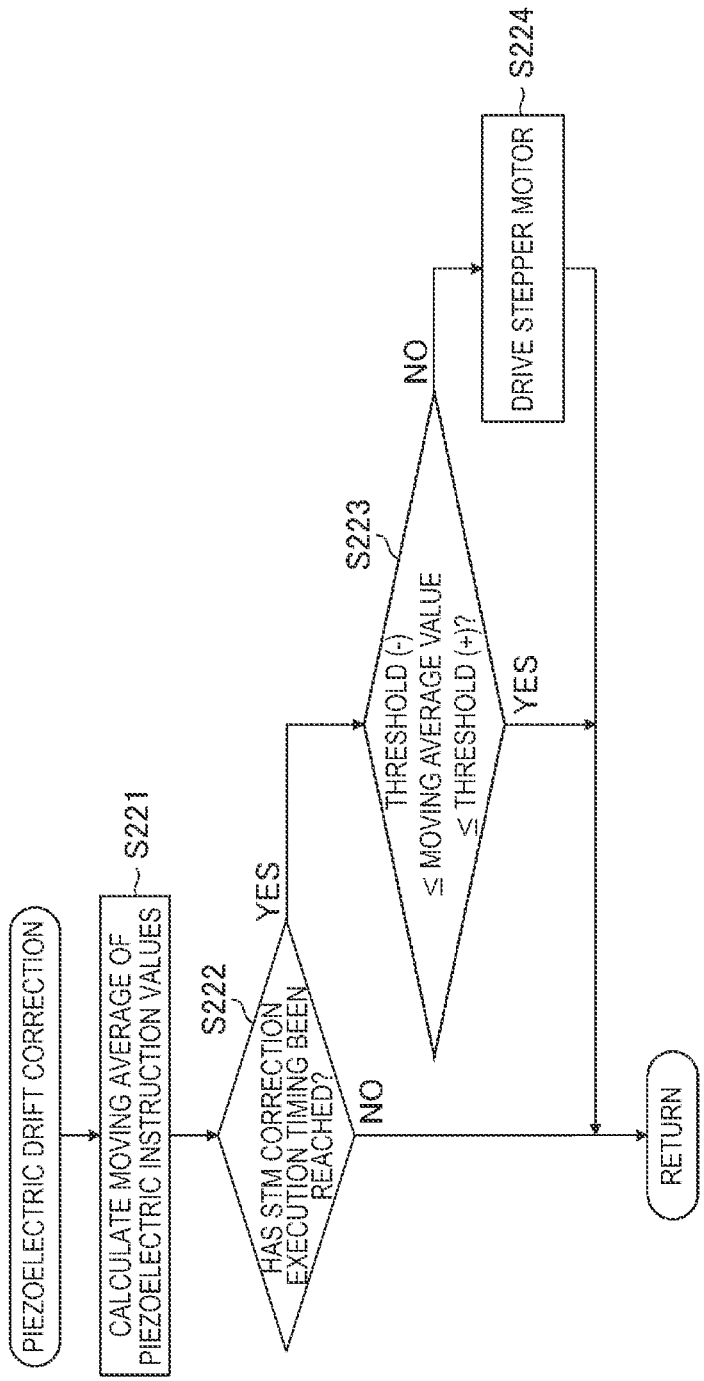
FIG. 14 is a flowchart showing an example of a subroutine applied to step S22 in FIG. 11.

FIG. 14 is a flowchart showing an example of a subroutine applied to step S22 in FIG. 11. In step S221, the processor 29 calculates the moving average of the piezoelectric instruction values. The segment over which the moving average is calculated may be an integer multiple of the wavelength instruction cycle, which in this case is the cycle T.

Thereafter, in step S222, the processor 29 evaluates whether the STM correction execution timing has been reached. The STM correction execution timing may occur every cycle, every pulse, or at any timing set in advance.

When the result of the evaluation in step S222 is NO, the processor 29 terminates the flowchart of FIG. 14 and returns to the main procedure of FIG. 11.

On the other hand, when the result of the evaluation in step S222 is YES, the processor 29 proceeds to step S223. In step S223, the processor 29 evaluates whether the moving average of the piezoelectric instruction values is greater than or equal to the threshold value (−) but smaller than or equal to the threshold value (+). The processor 29 determines that the moving average exceeds the thresholds when the moving average of the piezoelectric instruction values determined in step S221 is smaller than the threshold (−) or greater than the threshold value (+).

When the result of the evaluation in step S223 is YES, the processor 29 terminates the flowchart of FIG. 14 and returns to the main procedure of FIG. 11.

On the other hand, when the result of the evaluation in step S223 is NO, the processor 29 proceeds to step S224. In step S224, the processor 29 drives the stepper motor. After step S224, the processor 29 terminates the flowchart of FIG. 14 and returns to the main procedure of FIG. 11.

3.4 Effects and Advantages

In the laser apparatus according to the first embodiment, even when the wavelength instruction is cyclically changed in the form of a rectangular wave, the drift of the piezoelectric instruction due, for example, to a temperature change can be correctly detected and corrected by calculating the moving average of the piezoelectric instruction values over a segment that is an integer multiple of the wavelength instruction cycle.

Furthermore, the piezoelectric drift correction implemented by the first embodiment allows the piezoelectric element to always operate at the neutral position, whereby the hysteresis of the piezoelectric element can be readily corrected even when the wavelength instruction is cyclically changed. The hysteresis correction will be described in a third embodiment, which will be described later.

4. Second Embodiment

4.1 Configuration

The configuration of the laser apparatus according to the second embodiment may be the same as that of the excimer laser apparatus 11 shown in FIGS. 5 to 7.

4.2 Operation

The laser apparatus according to the second embodiment differs from the laser apparatus according to the first embodiment in terms of the operation including the control performed by the processor 29. The operation of the laser apparatus according to the second embodiment will be described below in terms of points different from those in the first embodiment.

Figure 15:
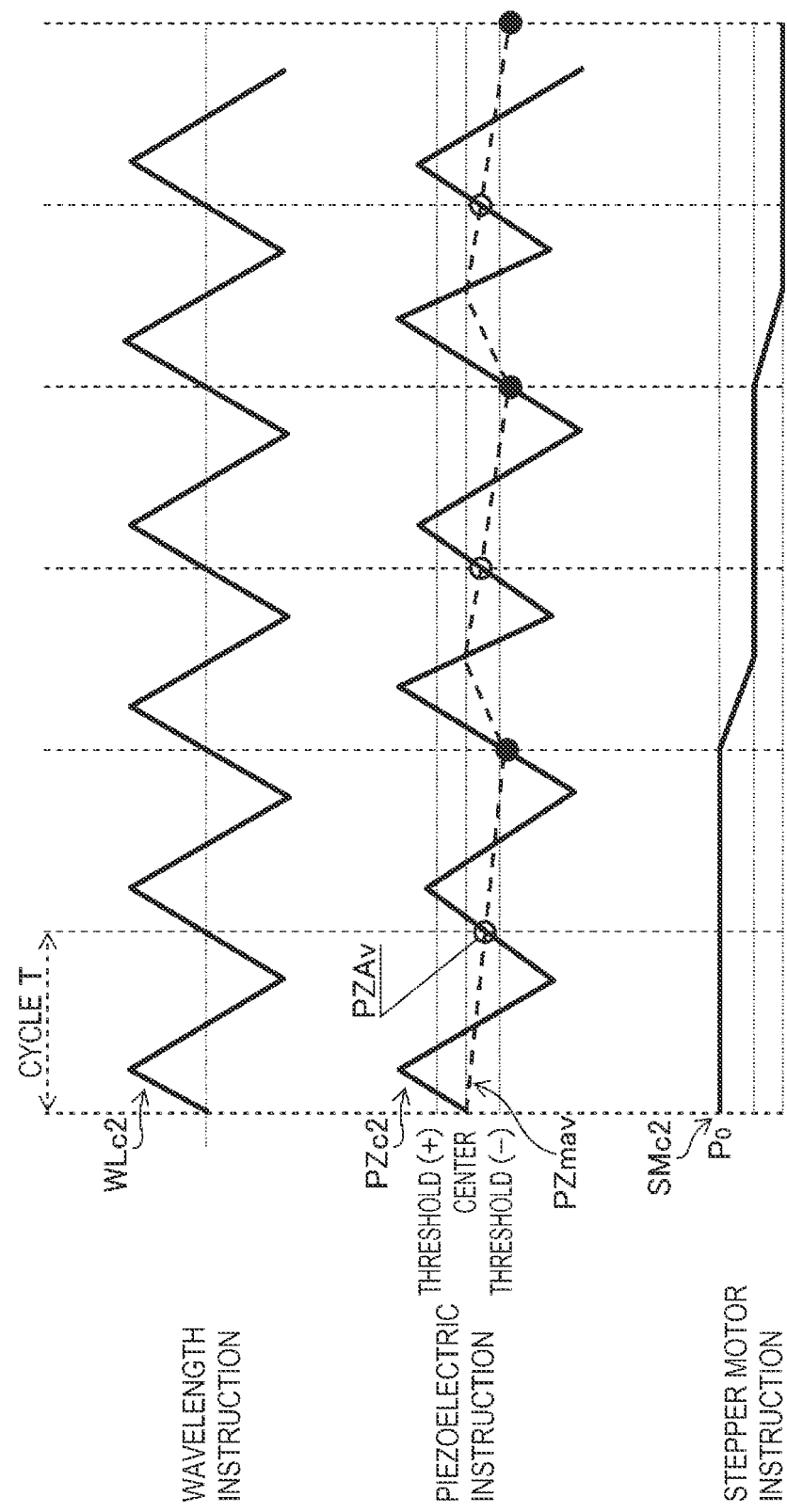
FIG. 15 is a timing chart showing an example of the operation of a laser apparatus according to a second embodiment.

FIG. 15 is a timing chart showing an example of the operation of the laser apparatus according to the second embodiment. The upper portion of FIG. 15 shows a waveform WLc2 of the wavelength instruction, the middle portion shows a waveform PZc2 of the piezoelectric instruction given to the piezoelectric element, and the lower portion shows a waveform SMc2 of the stepper motor instruction given to the stepper motor.

The waveform WLc2 of the wavelength instruction is a triangular wave, and the wavelength instruction changes on a pulse basis within the cycle T. The waveform WLc2 shown in FIG. 15 is drawn with straight lines, but is in practice a waveform in which a discrete instruction value for each pulse changes by a small amount in the form of a staircase (increments/decrements on a pulse basis).

The waveform PZc2 of the piezoelectric instruction has instruction values that change in the form of a triangular wave in conjunction with the triangular-wave wavelength instruction. The piezoelectric instruction has a first threshold and a second threshold set therein, as in FIG. 10.

The processor 29 calculates the moving average of the piezoelectric instruction values over a segment that is an integer multiple of the triangular-wave wavelength instruction cycle (cycle T), and drives the stepper motor to correct the drift of the piezoelectric instruction when the piezoelectric instruction moving average PZmav exceeds the thresholds. In FIG. 15, the piezoelectric instruction moving average PZmav is drawn with the broken line.

At the timing indicated by each of the black circles shown in FIG. 15, the stepper motor driving instruction is changed, and the piezoelectric instruction is changed accordingly. FIG. 15 shows the case where the operation of driving the stepper motor starts at a timing that is an integer multiple of the cycle T, and the timing at which the stepper motor is driven to make the correction may not be a timing that is an integer multiple of the cycle T, as in the first embodiment. The flowchart showing the control in the second embodiment may be the same as the flowcharts shown in FIGS. 11 to 14.

FIG. 15 shows the case where the wavelength instruction is changed in the form of a triangular wave, but the waveform of the cyclically changed wavelength instruction is not limited to a triangular wave, and can, for example, be a sinusoidal wave. The "sinusoidal wave" in the above description is a waveform of discrete changes for each pulse, as in the case of the triangular wave. The wavelength instruction may be changed in the form of a sinusoidal wave on a pulse basis.

4.3 Effects and Advantages

As described in the second embodiment, even when the wavelength instruction is cyclically changed in the form, for example, of a triangular or sinusoidal wave, the drift of the piezoelectric instruction due, for example, to a temperature change can be correctly detected and corrected by calculating the moving average of the piezoelectric instruction values over a segment that is an integer multiple of the wavelength instruction cycle.

5. Third Embodiment 5.1 Configuration

The configuration of the laser apparatus according to a third embodiment may be the same as that of the excimer laser apparatus 11 shown in FIGS. 5 to 7.

5.2 Operation

The laser apparatus according to the third embodiment differs from the laser apparatus according to the first embodiment in terms of the operation including the control performed by the processor 29. The operation of the laser apparatus according to the third embodiment will be described below in terms of points different from those in the first embodiment. In addition to the operation described in the first embodiment, the laser apparatus according to the third embodiment performs hysteresis correction described below.

Figure 16:
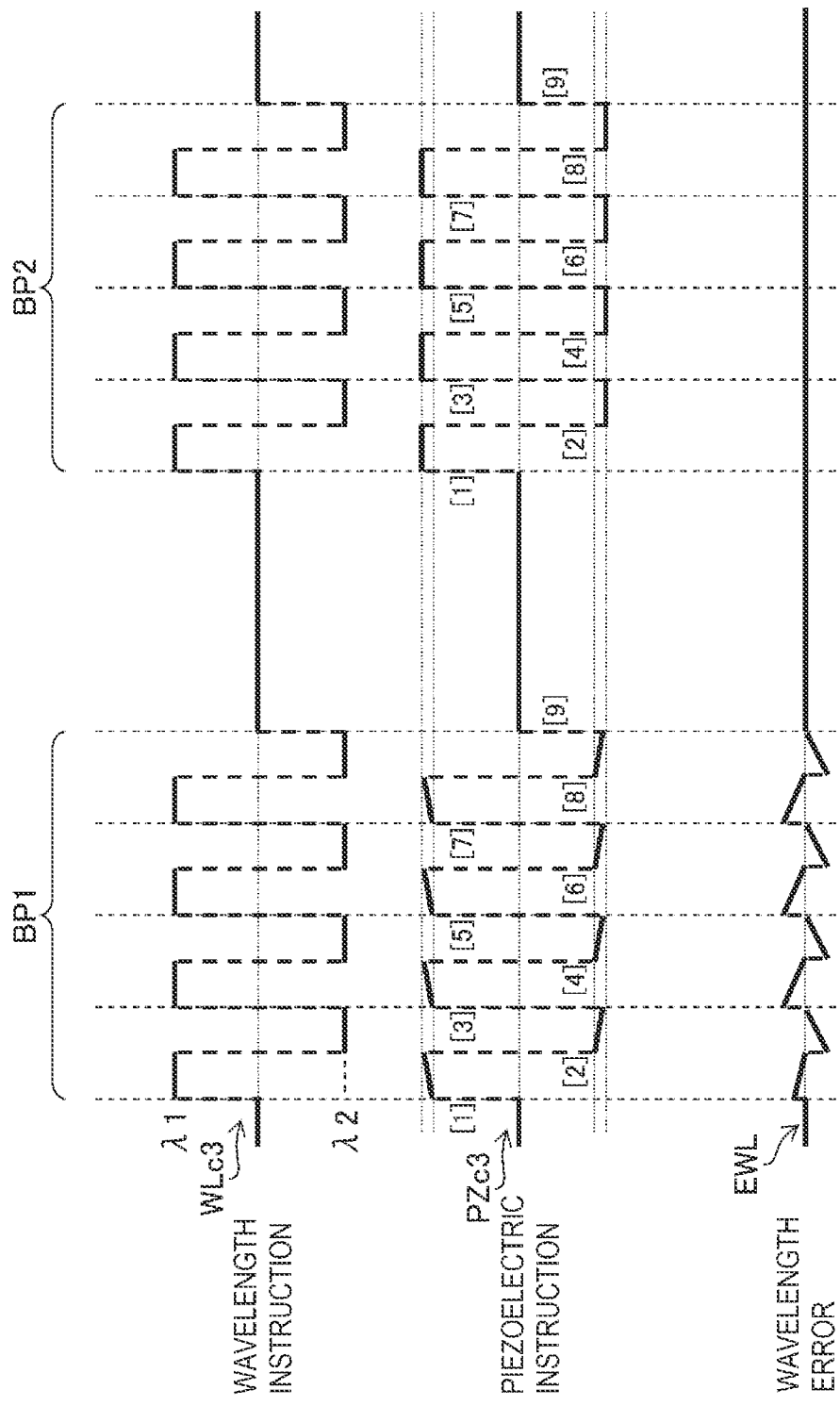
FIG. 16 is a timing chart for hysteresis correction performed by a laser apparatus according to a third embodiment.

FIG. 16 is a timing chart for the hysteresis correction performed by the laser apparatus according to the third embodiment. The upper portion of FIG. 16 shows a waveform WLc3 of the wavelength instruction, the middle portion shows a waveform PZc3 of the piezoelectric instruction given to the piezoelectric element, and the lower portion shows an example of the result of measurement of a wavelength error EWL showing the difference between the wavelength instruction and the center wavelength measured by the wavelength monitor 37.

Provided that the wavelength instruction is cyclically changed in the form of a rectangular wave, the processor 29 measures in advance an error between the piezoelectric instruction value immediately after the wavelength change and the piezoelectric instruction value immediately before the next wavelength change to calculate a value by which the piezoelectric instruction is corrected. Thereafter, to change the wavelength instruction by using the same driving pattern, the piezoelectric instruction is corrected by using the same correction value to control the wavelength.

The segment of the wavelength instruction that instructs the wavelength $\lambda 1$ to which the wavelength is changed at the timing indicated by the number [1] in FIG. 16 is called a first instruction segment, and the segment of the wavelength instruction that instructs the wavelength $\lambda 2$ to which the wavelength is changed at the timing indicated by the number [2] in FIG. 16 is called a second instruction segment. Similarly, the segments of the wavelength instructions changed at the timings indicated by the numbers [3] to [9] are called third to ninth instruction segments.

The error between the piezoelectric instruction value immediately after the wavelength is changed in the first instruction segment, where the wavelength instruction is changed at the timing of the wavelength change indicated by the number [1], and the piezoelectric instruction value immediately before the timing of the wavelength change indicated by the number [2] corresponds, i.e., to the difference between the piezoelectric instruction value immediately after the start of the first instruction segment and the piezoelectric instruction value immediately before the end of the first instruction segment. The processor 29 measures the error of the piezoelectric instruction value in the first instruction segment, determines a correction value to be applied to the subsequent first instruction segments where the piezoelectric instruction is changed by using the same driving pattern, and corrects the piezoelectric instruction by applying the correction value to the piezoelectric instruction in the subsequent first instruction segments.

Similarly, the processor 29 measures the error between the piezoelectric instruction value immediately after the start of the k-th instruction segment where the wavelength instruction is changed at the wavelength change timing indicated by the number [k] and the piezoelectric instruction value immediately before the end of the k-th instruction segment, determines, from the measured error, a correction value to be applied to the subsequent k-th instruction segments where the piezoelectric instruction is changed by using the same driving pattern, and corrects the piezoelectric instruction by applying the correction value to the subsequent k-th instruction segments.

The driving pattern at the timing indicated by the number [1] is a pattern in accordance with which the instruction value that instructs the neutral position is changed to the instruction value corresponding to the wavelength λ1. The driving pattern at the timing indicated by the number [2] is a pattern in accordance with which the instruction value corresponding to the wavelength λ1 is changed to the instruction value corresponding to the wavelength λ2. The driving patterns at the timings indicated by the numbers [4], [6], and [8] are the same as the drive pattern indicated by the number [2]. The same correction value may be applied to the instruction value in the second, fourth, sixth, and eighth instruction segments.

The driving pattern at the timings indicated by the numbers [3], [5], and [7] is a pattern in accordance with which the instruction value corresponding to the wavelength λ2 is changed to the instruction value corresponding to the wavelength λ1. The same correction value may be applied to the instruction value in the third, fifth, and seventh instruction segments. The driving pattern at the timing indicated by the number [9] is a pattern in accordance with which the instruction value corresponding to the wavelength λ2 is changed to the instruction value that instructs the neutral position.

The correction value may be calculated by using a piezoelectric coefficient derived from the wavelength error immediately after the wavelength change in place of the piezoelectric instruction error. The bottom portion of FIG. 16 shows examples of the wavelength errors measured in the first to ninth instruction segments.

Based on the result of the measurement of the wavelength error at first burst pulses BP1 shown in the left portion of FIG. 16, the processor 29 may correct the piezoelectric instructions in subsequent second burst pulses BP2. For example, the processor 29 may store a measured value of the center wavelength corresponding to the target wavelength of a p-th pulse of the first burst pulses BP1 and correct the piezoelectric instruction for the p-th pulse of the subsequent second burst pulses BP2 based on the difference between the target wavelength and the measured value of the stored p-th pulse. Symbol p is an integer greater than or equal to one and represents the pulse number in the burst pulses.

The first burst pulses BP1 may be used to perform the tuning oscillation before the exposure (actual exposure) of the wafer WF is performed. The second burst pulses BP2 may be used to perform the actual exposure oscillation.

FIG. 16 shows the case where a correction value is determined based on the error measured in the preceding segment using the same driving pattern and the determined correction value is used for the correction in the next corresponding segment, and the same averaged correction value may be used for the same driving pattern.

For example, correction values may be determined in a plurality of preceding corresponding segments using the same driving pattern, and the correction values may be averaged. Still instead, even after the in-advance correction value calculation is completed, the correction values may be always averaged and updated to repeat the wavelength change.

5.3 Example of Hysteresis Correction Control

Figure 17:
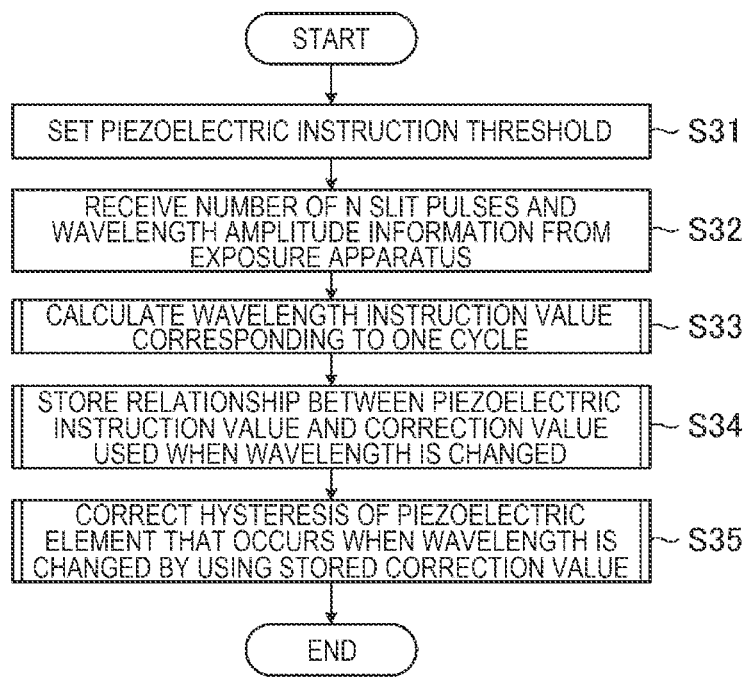
FIG. 17 is a flowchart showing an example of the hysteresis correction control performed by the laser apparatus according to the third embodiment.

FIG. 17 is a flowchart showing an example of the hysteresis correction control performed by the laser apparatus according to the third embodiment. Steps S31, S32, and S33 may be the same as steps S11, S12, and S13 shown in FIG. 11, which are corresponding steps.

After step S33, in step S34, the processor 29 carries out the process of storing the relationship between the piezoelectric instruction value and the correction value used when the wavelength is changed.

Thereafter, in step S35, the processor 29 corrects the hysteresis of the piezoelectric element that occurs when the wavelength is changed by using the stored correction value.

After step S35, the processor 29 terminates the flowchart of FIG. 17.

Figure 18:
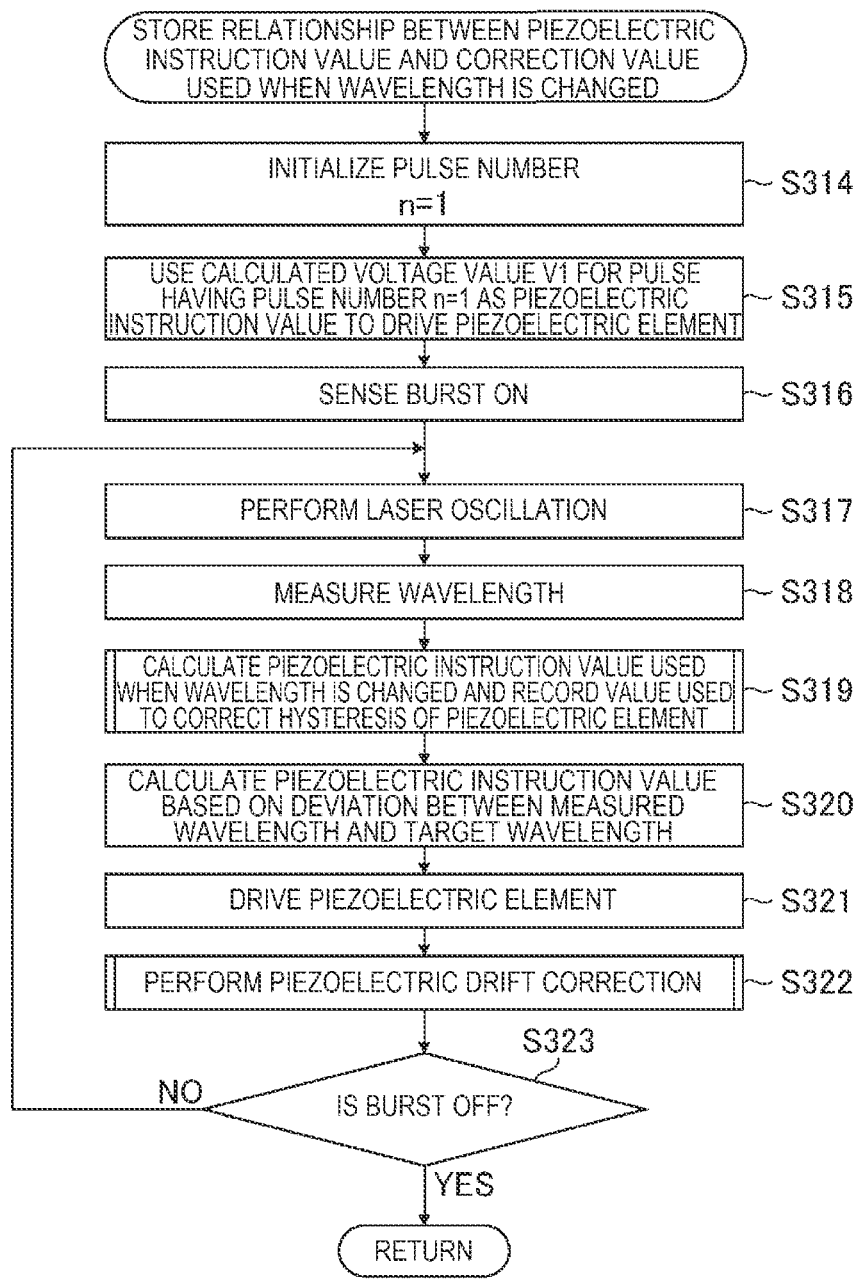
FIG. 18 is a flowchart showing an example of a subroutine applied to step S34 in FIG. 17.

FIG. 18 is a flowchart showing an example of a subroutine applied to step S34 in FIG. 17. Steps S314, S315, S316, S317, and S318 in FIG. 18 may be the same as steps S14, S15, S16, S17, and S18 shown in FIG. 11, which are corresponding steps.

After step S318, in step S319, the processor 29 calculates the piezoelectric instruction value used when the wavelength is changed and records the value used to correct the hysteresis of the piezoelectric element.

Steps S320, S321, S322, and S323 after step S319 may be the same as steps S20, S21, S22, and S23 shown in FIG. 11, which are corresponding steps. When the result of the evaluation in step S323 is NO, the processor 29 returns to step S317. On the other hand, when the result of the evaluation in step S323 is YES, the processor 29 terminates the flowchart of FIG. 18 and returns to the main procedure of FIG. 17.

Figure 19:
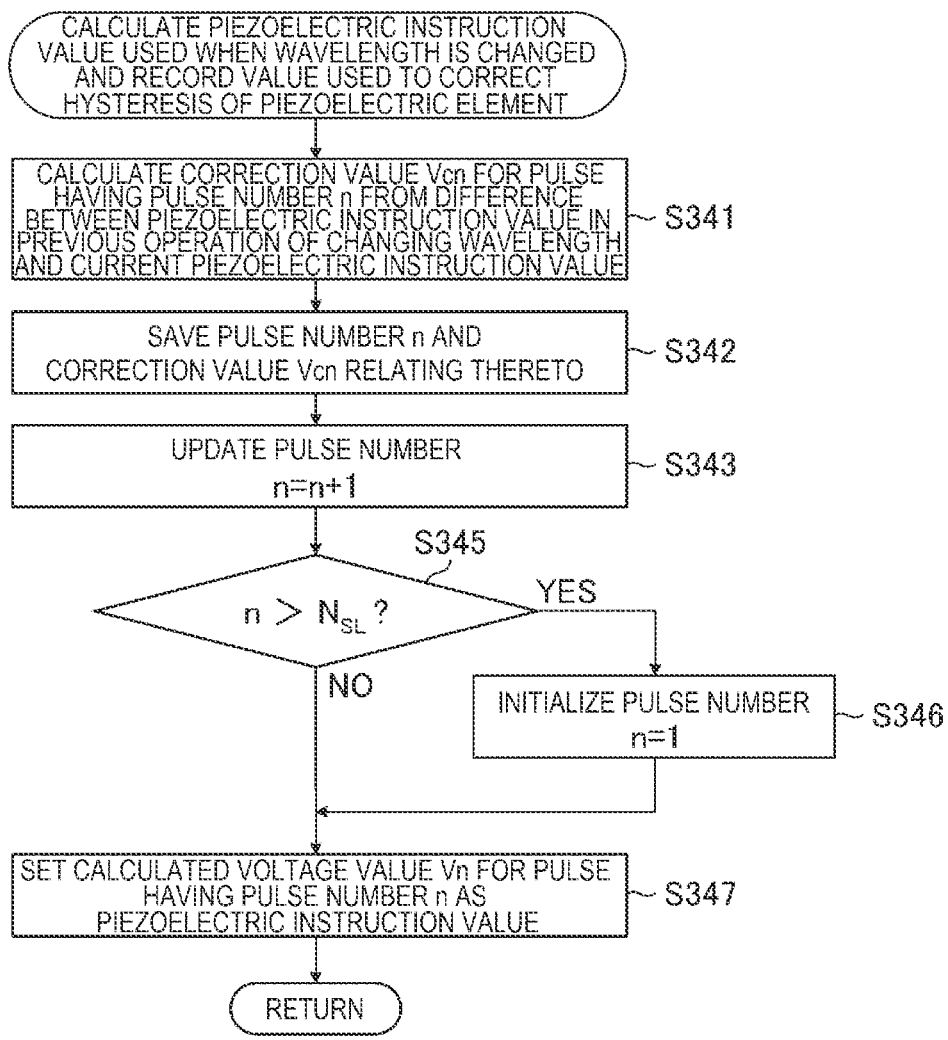
FIG. 19 is a flowchart showing an example of a subroutine applied to step S319 in FIG. 18.

FIG. 19 is a flowchart showing an example of a subroutine applied to step S319 in FIG. 18. In step S341, the processor 29 calculates a correction value Vcn for the pulse having the pulse number n from the difference between the piezoelectric instruction value in the previous operation of changing the wavelength and the current piezoelectric instruction value.

Thereafter, in step S342, the processor 29 associates the pulse number n with the correction value Vcn relating thereto and saves the resultant information.

Thereafter, in step S343, the processor 29 evaluates whether the pulse number n is greater than the number of N slit pulses $N_{SL}$, which represents one cycle T, that is, $n > N_{SL}$ is satisfied. When the result of the evaluation in step S343 is YES, the processor 29 proceeds to step S346.

In step S346, the processor 29 initializes the pulse number n to achieve n=1. After step S346, the processor 29 proceeds to step S347.

On the other hand, when the result of the evaluation in step S345 is NO, the processor 29 proceeds to step S347.

In step S347, the processor 29 sets the calculated voltage value Vn for the pulse having the pulse number n as the piezoelectric instruction value. After step S347, the processor 29 terminates the flowchart of FIG. 19 and returns to the flowchart of FIG. 18.

Figure 20:
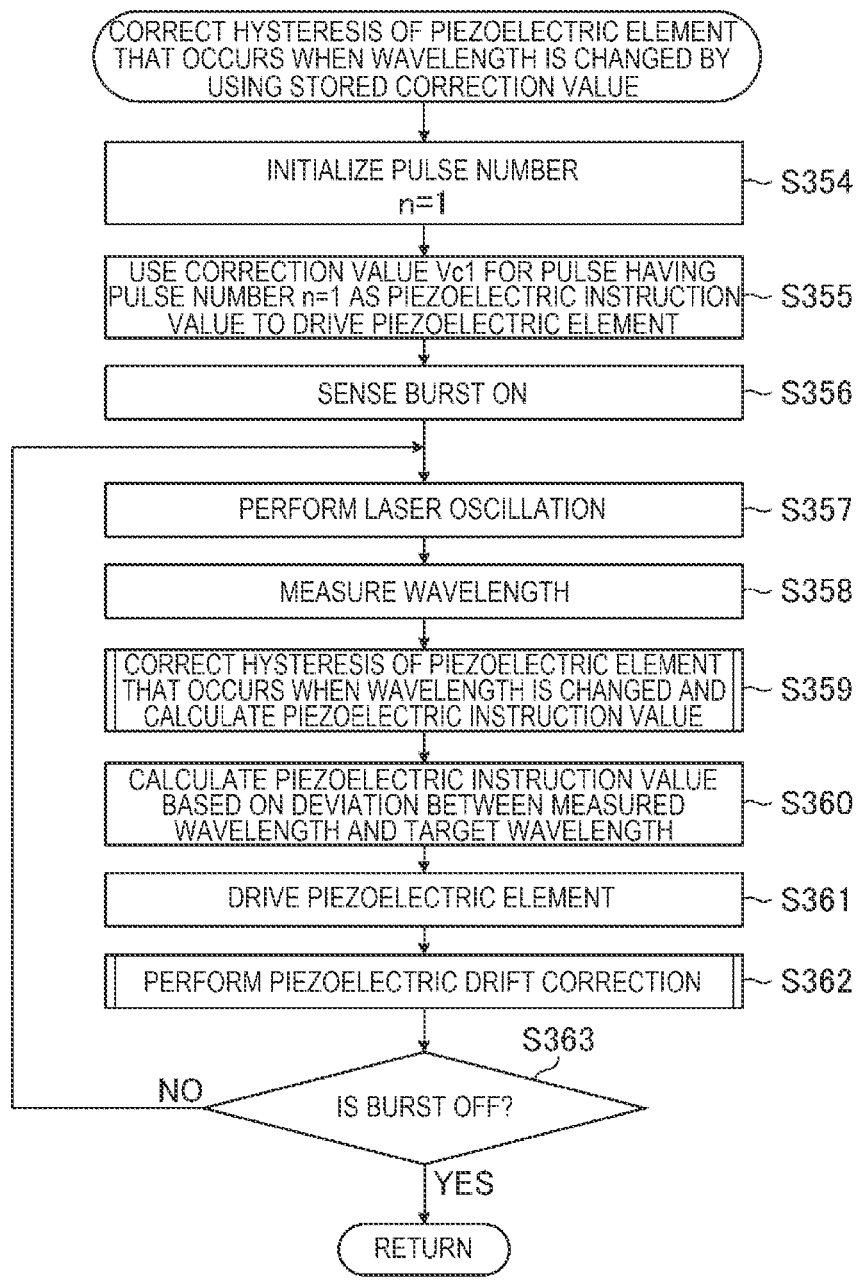
FIG. 20 is a flowchart showing an example of a subroutine applied to step S35 in FIG. 17.

FIG. 20 is a flowchart showing an example of a subroutine applied to step S35 in FIG. 17. Steps S354, S355, S356, S357, and S358 in FIG. 20 may be the same as steps S14, S15, S16, S17, and S18 shown in FIG. 11, which are corresponding steps.

After step S358, in step S359, the processor 29 corrects the hysteresis of the piezoelectric element that occurs when the wavelength is changed and calculates the piezoelectric instruction value.

Steps S360, S361, S362, and S363 after step S359 may be the same as steps S20, S21, S22, and S23 shown in FIG. 11, which are corresponding steps. When the result of the evaluation in step S363 is NO, the processor 29 returns to step S357. On the other hand, when the result of the evaluation in step S363 is YES, the processor 29 terminates the flowchart of FIG. 20 and returns to the main procedure of FIG. 17.

Figure 21:
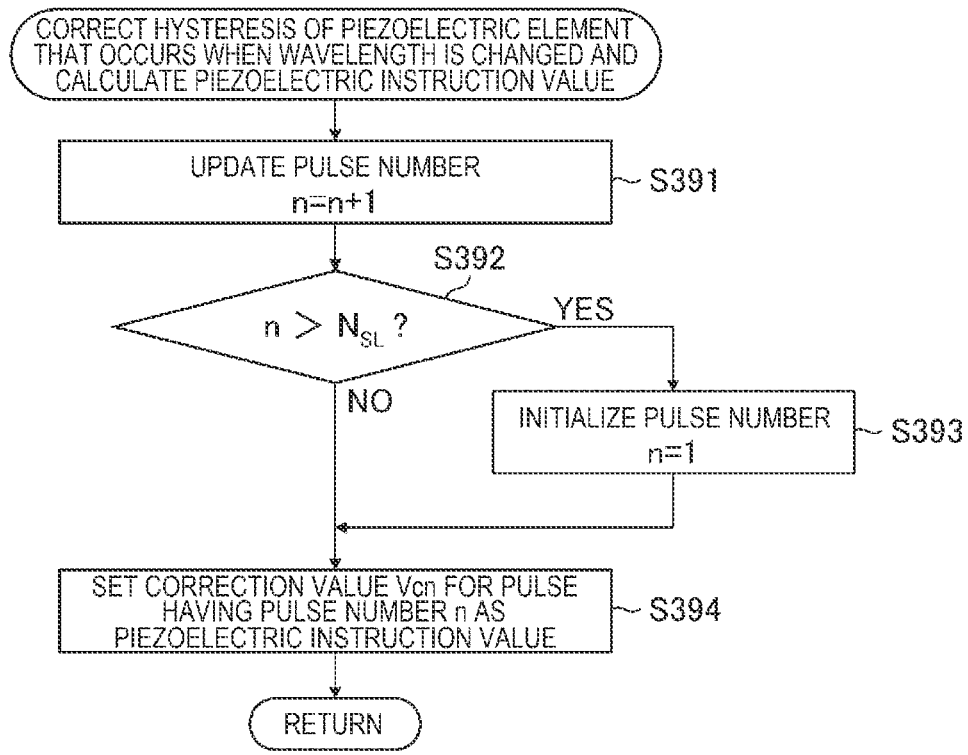
FIG. 21 is a flowchart showing an example of a subroutine applied to step S359 in FIG. 20.

FIG. 21 is a flowchart showing an example of a subroutine applied to step S359 in FIG. 20. In step S391, the processor 29 increments the pulse number n into n+1 and updates the pulse number in such a way that the value n+1 is the new value of the pulse number n.

Thereafter, in step S392, the processor 29 evaluates whether the pulse number n exceeds the number of pulses in one cycle T.

When the result of the evaluation in step S392 is NO, the processor 29 proceeds to step S394. In step S394, the processor 29 sets the correction value Vcn for the pulse having the pulse number n as the piezoelectric instruction value.

On the other hand, when the result of the evaluation in step S392 is YES, the processor 29 proceeds to step S393. In step S393, the processor 29 initializes the pulse number n to achieve n=1. After step S393, the processor 29 proceeds to step S394.

After step S394, the processor 29 terminates the flowchart of FIG. 21 and returns to the flowchart of FIG. 20.

Figure 22:
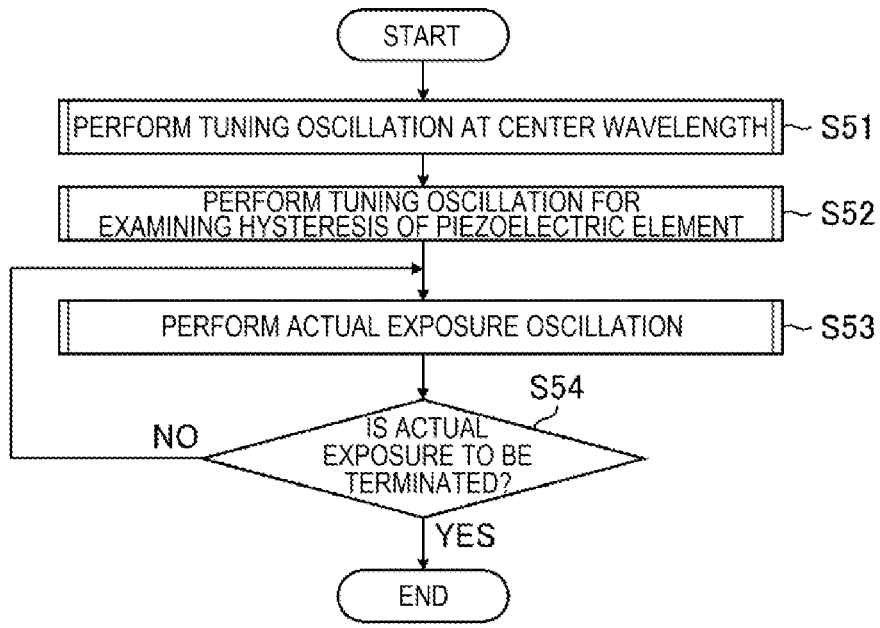
FIG. 22 is a flowchart showing an example of control of a series of operations including tuning oscillation and actual exposure in the laser apparatus according to the third embodiment.

5.4 Example of Control of a Series of Operations Including Tuning Oscillation and Actual Exposure FIG. 22 is a flowchart showing an example of control of a series of operations including the tuning oscillation and the actual exposure in the laser apparatus according to the third embodiment.

In step S51, the processor 29 performs the tuning oscillation at the center wavelength.

Thereafter, in step S52, the processor 29 performs the tuning oscillation for examining the hysteresis of the piezoelectric element.

Thereafter, in step S53, the processor 29 performs the actual exposure oscillation.

Thereafter, in step S54, the processor 29 evaluates whether the actual exposure is to be terminated. When the result of the evaluation in step S54 is NO, the processor 29 returns to step S53. On the other hand, when the result of the evaluation in step S54 is YES, the processor 29 terminates the flowchart of FIG. 22.

Figure 23:
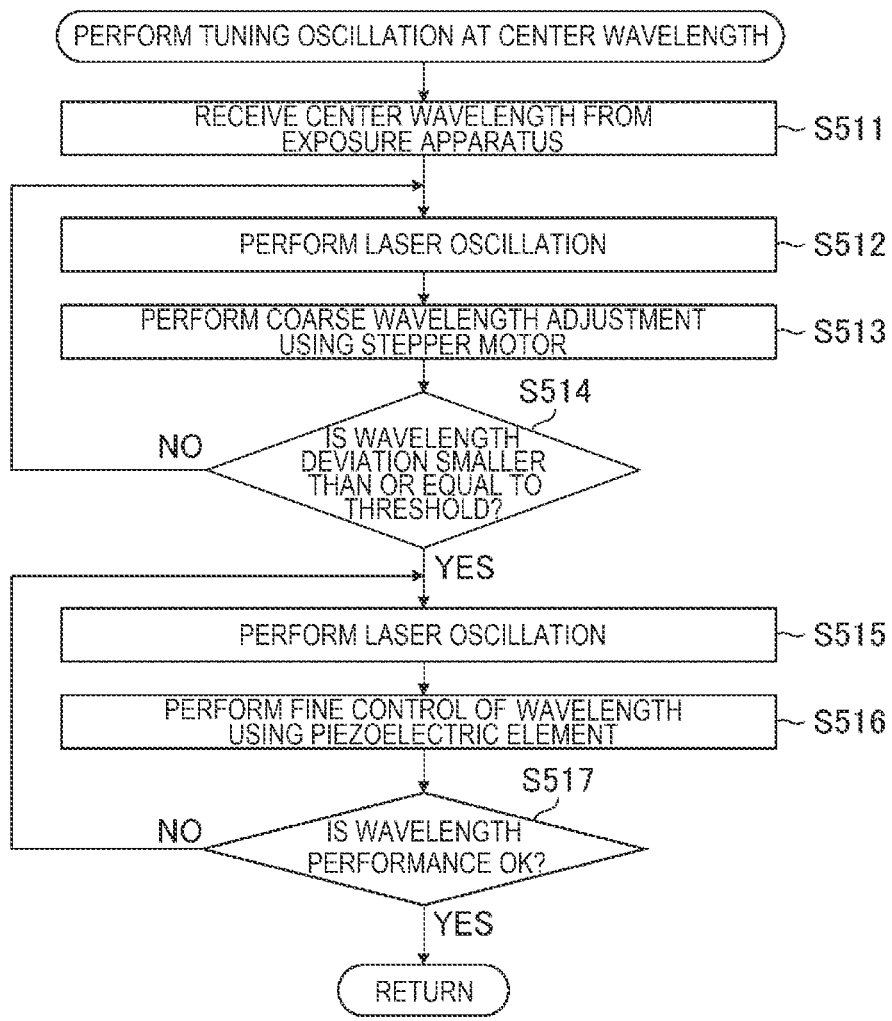
FIG. 23 is a flowchart showing an example of a subroutine applied to step S51 in FIG. 22.

FIG. 23 is a flowchart showing an example of a subroutine applied to step S51 in FIG. 22.

In step S511, the processor 29 receives data on the center wavelength from the exposure apparatus 25.

Thereafter, in step S512, the processor 29 performs the laser oscillation.

Thereafter, in step S513, the processor 29 performs coarse adjustment of the wavelength by driving the stepper motor.

Thereafter, in step S514, the processor 29 evaluates whether wavelength deviation between the measured wavelength and the specified center wavelength is smaller than or equal to a threshold. The threshold in this case is an evaluation reference value that specifies an acceptable range of the wavelength deviation. When the result of the evaluation in step S514 is NO, the processor 29 returns to step S512, and the stepper motor is driven in step S513 to adjust the output wavelength.

When the result of the evaluation in step S514 is YES, the processor 29 proceeds to step S515. In step S515, the processor 29 performs the laser oscillation.

Thereafter, in step S516, the processor 29 performs fine adjustment of the wavelength by driving the piezoelectric element.

Thereafter, in step S517, the processor 29 evaluates whether the wavelength performance satisfies a required reference. When the result of the evaluation in step S517 is NO, the processor 29 returns to step S515. On the other hand, when the result of the evaluation in step S517 is YES, the processor 29 terminates the flowchart of FIG. 23 and returns to the main procedure of FIG. 22.

Figure 24:
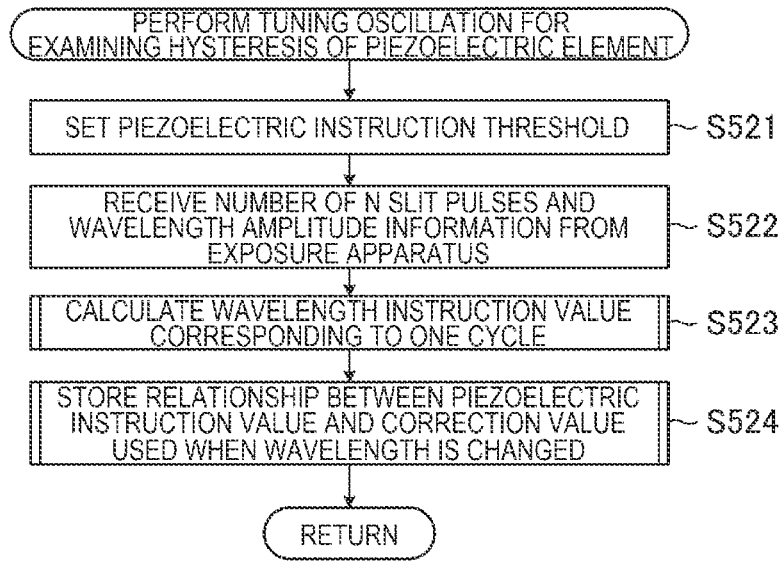
FIG. 24 is a flowchart showing an example of a subroutine applied to step S52 in FIG. 22.

FIG. 24 is a flowchart showing an example of a subroutine applied to step S52 in FIG. 22.

In step S521, the processor 29 sets a threshold of the piezoelectric instruction value.

Thereafter, in step S522, the processor 29 receives from the exposure apparatus 25 the number of N slit pulses $N_{SL}$ and the wavelength amplitude information.

Thereafter, in step S523, the processor 29 calculates the wavelength instruction value corresponding to one cycle. A subroutine applied to step S523 may be the same as the subroutine in the flowchart of FIG. 12.

Thereafter, in step S524, the processor 29 carries out the process of storing the relationship between the piezoelectric instruction value and the correction value used when the wavelength is changed. A subroutine applied to step S524 may be the same as the subroutine in the flowchart of FIG. 18.

After step S524, the processor 29 terminates the flowchart of FIG. 24 and returns to the main procedure of FIG. 22.

Figure 25:
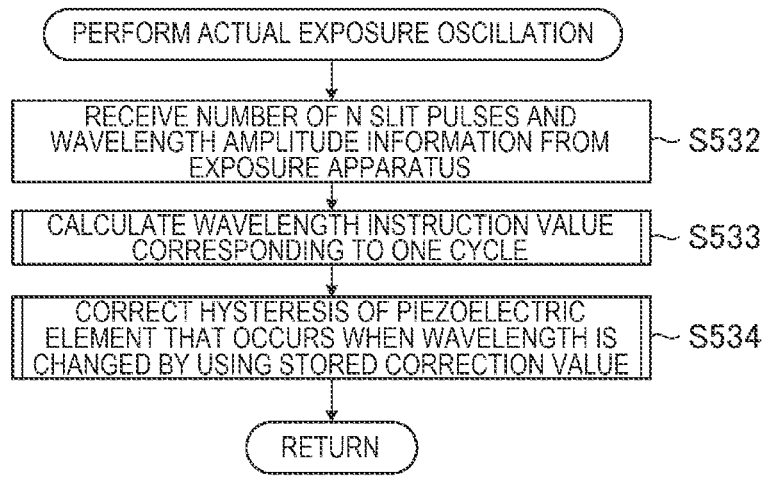
FIG. 25 is a flowchart showing an example of a subroutine applied to step S53 in FIG. 22.

FIG. 25 is a flowchart showing an example of a subroutine applied to step S53 in FIG. 22.

In step S532, the processor 29 receives from the exposure apparatus 25 the number of N slit pulses $N_{SL}$ and the wavelength amplitude information.

Thereafter, in step S533, the processor 29 calculates the wavelength instruction value corresponding to one cycle. A subroutine applied to step S533 may be the same as the subroutine in the flowchart of FIG. 12.

Thereafter, in step S534, the processor 29 carries out the process of correcting the hysteresis of the piezoelectric element that occurs when the wavelength is changed by using the stored correction value. A subroutine applied to step S534 may be the same as the subroutine in the flowchart of FIG. 20.

After step S534, the processor 29 terminates the flowchart of FIG. 25 and returns to the main procedure of FIG. 22.

5.5 Effects and Advantages

According to the third embodiment, a wavelength error due to the hysteresis of the piezoelectric element can be corrected even when the wavelength instruction is cyclically changed. Even when the hysteresis characteristic of the piezoelectric element changes over time, the wavelength error can still be appropriately corrected by repeating the averaging process in determining a correction value used for the hysteresis correction.

6. Fourth Embodiment 6.1 Configuration

Figure 26:
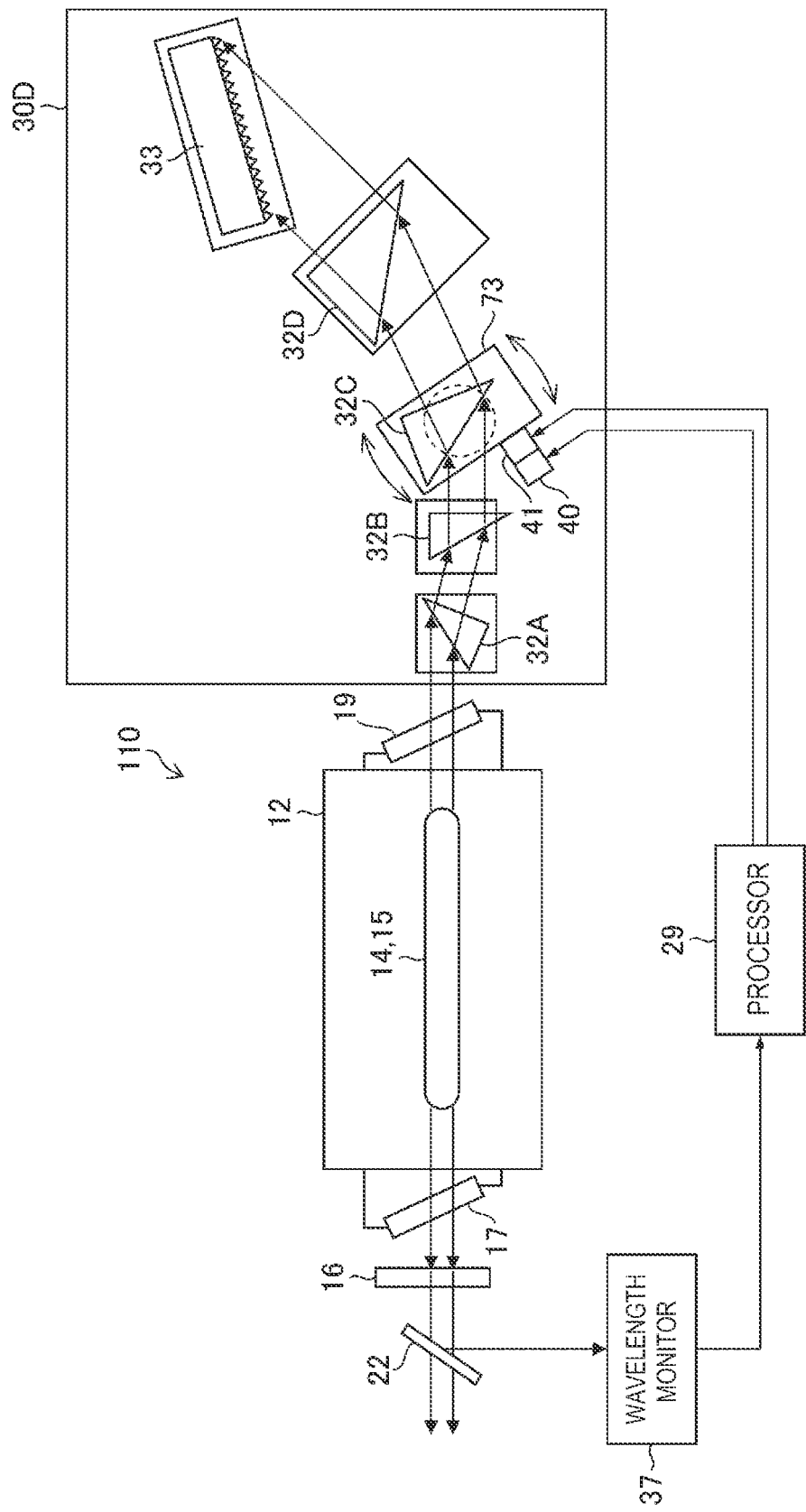
FIG. 26 schematically shows the configuration of a laser apparatus according to a fourth embodiment.

FIG. 26 schematically shows the configuration of a laser apparatus 110 according to a fourth embodiment. Differences in configuration between FIGS. 26 and 5 will be described. The laser apparatus 110 is an ArF excimer laser apparatus, and the line narrowing unit 30 shown in FIG. 5 is replaced with a line narrowing unit 30D. The line narrowing unit 30D includes a first prism 32A, a second prism 32B, a third prism 32C, a fourth prism 32D, and the grating 33.

The third prism 32C includes a wavelength control mechanism coarsely driven by the stepper motor unit 40 and a wavelength control mechanism finely driven by the piezoelectric element unit 41. That is, the wavelength is controlled by driving the wavelength selection mirror 34 in the first to third embodiments, whereas the wavelength is controlled by driving the third prism 32C in the fourth embodiment. The third prism 32C is fixed to a rotary stage 73, which is rotated by at least one of the stepper motor unit 40 and the piezoelectric element unit 41 to rotate the third prism 32C. Rotation of the third prism 32C changes the angle of incidence of the pulse laser light to be incident on the grating 33.

6.2 Operation

Except that the third prism 32C is driven in the fourth embodiment in place of the wavelength selection mirror 34 described in the first embodiment, the other operations may be the same as those in the first to third embodiments.

6.3 Effects and Advantages

The laser apparatus 110 according to the fourth embodiment provides the same effects as those provided in the first to third embodiments.

7. Fifth Embodiment

7.1 Configuration

Figure 27:
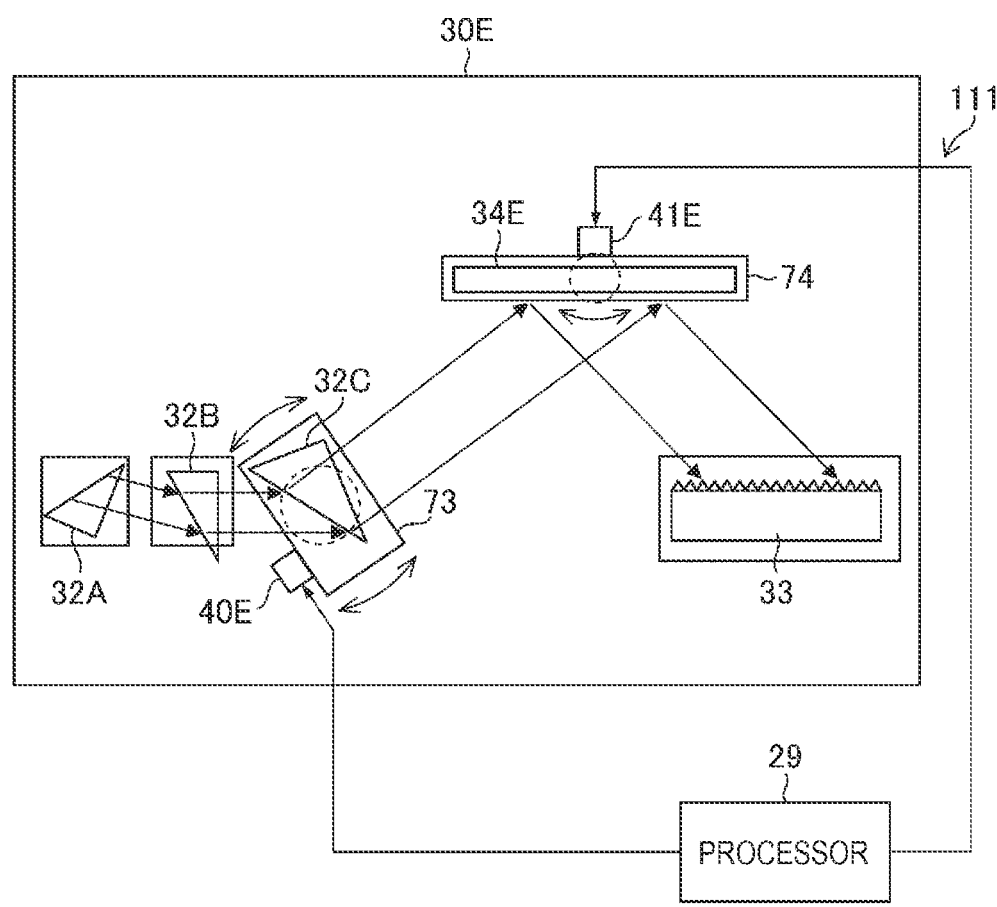
FIG. 27 schematically shows the configuration of a line narrowing unit used in a laser apparatus according to a fifth embodiment.

FIG. 27 schematically shows the configuration of a line narrowing unit 30E used in a laser apparatus 111 according to a fifth embodiment. The configurations that are not shown in FIG. 27 may be the same as those in FIG. 26. Differences in configuration between FIGS. 27 and 26 will be described. In FIG. 26, the stepper motor unit 40 and the piezoelectric element unit 41 both drive and rotate the third prism 32C. However, the optical element coarsely moved by the stepper motor unit and the optical element finely moved by the piezoelectric element unit may differ from each other.

The laser apparatus 111 according to the fifth embodiment includes the line narrowing unit 30E in place of the line narrowing unit 30D shown in FIG. 26. The line narrowing unit 30E includes a mirror 34E in place of the fourth prism 32D in FIG. 26, and a rotary stage 74, which supports the mirror 34E, is driven by a piezoelectric element unit 41E.

FIG. 27 shows a case where the third prism 32C is coarsely moved by a stepper motor unit 40E, and the mirror 34E is finely moved by the piezoelectric element unit 41E. The laser apparatus 111 may employ a configuration in which the piezoelectric element unit 41E and the stepper motor unit 40E shown in FIG. 27 are swapped, with the third prism 32C finely moved by the piezoelectric element unit 41E, the mirror 34E coarsely moved by the stepper motor unit 40E. In comparison between the mirror 34E and the third prism 32C, the mirror 34E can change the path of the pulse laser light by a greater amount provided that the mirror 34E and the third prism 32C are rotated by the same angle. It is therefore preferable that the optical element driven by the piezoelectric element be a mirror that excels in response performance.

7.2 Operation

Except that the mirror 34E is finely moved by the piezoelectric element unit 41E and the third prism 32C is coarsely moved by the stepper motor unit 40E, the other operations in the fifth embodiment may be the same as those in the first to fourth embodiments.

The third prism 32C is an example of the "first optical element" in the present disclosure, and the rotary stage 73 is an example of the "first rotary stage" in the present disclosure. The mirror 34E is an example of the "second optical element" in the present disclosure, and the rotary stage 74 is an example of the "second rotary stage" in the present disclosure. The stepper motor unit 40E is an example of the "first driving mechanism" in the present disclosure, and the piezoelectric element unit 41E is an example of the "second driving mechanism" in the present disclosure.

7.3 Effects and Advantages

The laser apparatus 111 according to the fifth embodiment provides the same effects as those provided in the first to fourth embodiments.

8. Method for Manufacturing Electronic Devices

Figure 28:
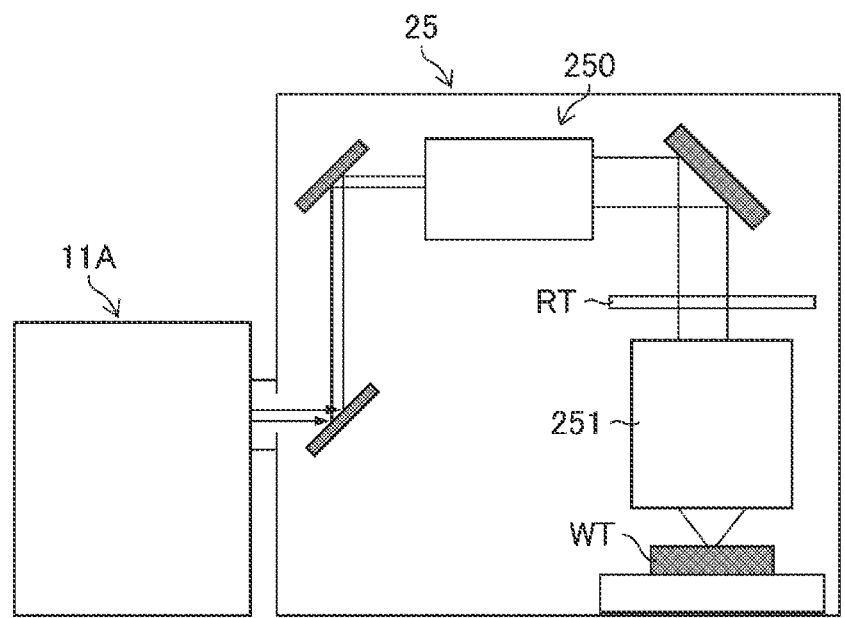
FIG. 28 schematically shows an example of the configuration of an exposure apparatus.

FIG. 28 schematically shows an example of the configuration of the exposure apparatus 25. The exposure apparatus 25 includes an illumination optical system 250 and a projection optical system 251. The illumination optical system 250 illuminates a reticle pattern of a reticle that is not shown but is placed on a reticle stage RT with laser light having entered the exposure apparatus 25 from a laser system 11A. The projection optical system 251 performs reduction projection on the laser light having passed through the reticle to cause the laser light to be brought into focus on a workpiece that is not shown but is placed on a workpiece table WT. The workpiece is a photosensitive substrate onto which a photoresist has been applied, such as a semiconductor wafer.

The exposure apparatus 25 translates the reticle stage RT and the workpiece table WT in synchronization with each other to expose the workpiece to the laser light having reflected the reticle pattern. Semiconductor devices can be manufactured by transferring the reticle pattern onto the semiconductor wafer in the exposure step described above and then carrying out a plurality of other steps. The semiconductor devices are an example of the "electronic devices" in the present disclosure.

The laser system 11A may have a configuration including the laser apparatus described in the first, second, or third embodiment, or the laser apparatus 110 or 111 described in the fourth or fifth embodiment.

9. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C"

should be interpreted to mean any of A, B, C, A+B, A+C, B+C, and A+B+C as well as to include combinations of any thereof and any other than A, B, and C.

What is claimed is:

1. A laser apparatus comprising:
an oscillator configured to output pulse laser light;
an optical element disposed in an optical path of the pulse laser light;
a rotary stage configured to support the optical element;
a grating on which the pulse laser light is incident via the optical element and which is disposed so as to cause diffracted light having a wavelength according to an angle of incidence of the pulse laser light to return to the oscillator;
a first driving mechanism configured to change the angle of incidence of the pulse laser light to be incident on the grating by driving the rotary stage to rotate the optical element;
a second driving mechanism configured to change the angle of incidence of the pulse laser light to be incident on the grating by driving the rotary stage by a smaller amount than an amount driven by the first driving mechanism to rotate the optical element;
a wavelength monitor configured to measure a center wavelength of the pulse laser light; and
a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor,
the processor configured to calculate a moving average of drive instruction values by which the second driving mechanism is driven over a segment that is an integer multiple of a wavelength instruction cycle in which the target wavelength is cyclically changed, the processor further configured, when the calculated moving average exceeds a threshold, to cause the second driving mechanism to return to an initial position, and drive the first driving mechanism to cancel a change in the angle of incidence caused by the return of the second driving mechanism to the initial position.

2. The laser apparatus according to claim 1, wherein the first driving mechanism includes a stepper motor, and
the second driving mechanism includes a piezoelectric element.

3. The laser apparatus according to claim 1, wherein the segment over which the moving average is calculated is one cycle of the wavelength instruction cycle.

4. The laser apparatus according to claim 1, wherein the wavelength instruction cycle is the number of pulses by which the same location is irradiated when the pulse laser light is radiated in the form of scan exposure.

5. The laser apparatus according to claim 1, wherein the processor is configured to change a wavelength instruction containing a plurality of consecutive pulses that instructs the target wavelength to coincide with a first wavelength and a wavelength instruction containing a plurality of consecutive pulses that instructs the target wavelength to coincide with a second wavelength to a rectangular-wave wavelength instruction.

6. The laser apparatus according to claim 1, wherein the processor is configured to change the target wavelength in a form of a triangular or sinusoidal wave on a pulse basis.

7. The laser apparatus according to claim 1, wherein the threshold includes a first threshold that specifies a lower limit and a second threshold that specifies an upper limit, and
the processor is configured to determine that the moving average exceeds the threshold when the moving average is smaller than the first threshold or when the moving average is greater than the second threshold.

8. The laser apparatus according to claim 1, wherein the initial position corresponds to half a full stroke of the second driving mechanism.

9. The laser apparatus according to claim 1, wherein the processor is configured to calculate a correction value used to correct the drive instruction that drives the second driving mechanism based on a difference between the drive instruction value by which the second driving mechanism is driven immediately after the wavelength is changed and the drive instruction value immediately before the wavelength is changed next time, and
when the wavelength is changed by using the same drive pattern used for the wavelength change in which the correction value is determined, the drive instruction that drives the second driving mechanism is corrected by using the correction value.

10. The laser apparatus according to claim 1, wherein let p be an integer greater than or equal to one, and the processor is configured to store the measured value corresponding to the target wavelength of a p-th pulse of first burst pulses, and
the processor corrects the drive instruction that drives the second driving mechanism for the p-th pulse of subsequent second burst pulses based on a relationship between the target wavelength and the measured value of the stored p-th pulse.

11. A method for manufacturing electronic devices, the method comprising:
generating laser light by a laser apparatus including
an oscillator configured to output pulse laser light,
an optical element disposed in an optical path of the pulse laser light,
a rotary stage configured to support the optical element,
a grating on which the pulse laser light is incident via the optical element and which is disposed so as to cause diffracted light having a wavelength according to an angle of incidence of the pulse laser light to return to the oscillator,
a first driving mechanism configured to change the angle of incidence of the pulse laser light to be incident on the grating by driving the rotary stage to rotate the optical element,
a second driving mechanism configured to change the angle of incidence of the pulse laser light to be incident on the grating by driving the rotary stage by a smaller amount than an amount driven by the first driving mechanism to rotate the optical element,
a wavelength monitor configured to measure a center wavelength of the pulse laser light, and
a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured, when the calculated moving average exceeds a threshold, to cause the second driving mechanism to return to an initial position, and drive the first driving mechanism to cancel a change in the angle of incidence caused by the return of the second driving mechanism to the initial position;

outputting the laser light to an exposure apparatus; and exposing a photosensitive substrate to the laser light in the exposure apparatus to manufacture electronic devices.

12. A laser apparatus comprising:

an oscillator configured to output pulse laser light;

a first optical element disposed in an optical path of the pulse laser light;

a first rotary stage configured to support the first optical element;

a second optical element disposed in the optical path of the pulse laser light;

a second rotary stage configured to support the second optical element;

a grating on which the pulse laser light is incident via the first and second optical elements and which is disposed so as to cause diffracted light having a wavelength according to an angle of incidence of the pulse laser light to return to the oscillator;

a first driving mechanism configured to change the angle of incidence of the pulse laser light to be incident on the grating by driving the first rotary stage to rotate the first optical element;

a second driving mechanism configured to change the angle of incidence of the pulse laser light to be incident on the grating by driving the second rotary stage by a smaller amount than an amount driven by the first driving mechanism to rotate the second optical element;

a wavelength monitor configured to measure a center wavelength of the pulse laser light; and a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured, when the calculated moving average exceeds a threshold, to cause the second driving mechanism to return to an initial position, and drive the first driving mechanism to cancel a change in the angle of incidence caused by the return of the second driving mechanism to the initial position;

13. The laser apparatus according to claim 12, wherein one of the first and second optical elements is a mirror and the other is a prism.

14. The laser apparatus according to claim 12, wherein the first driving mechanism includes a stepper motor, and the second driving mechanism includes a piezoelectric element.

15. The laser apparatus according to claim 12, wherein the segment over which the moving average is calculated is one cycle of the wavelength instruction cycle.

16. The laser apparatus according to claim 12, wherein the processor is configured to change a wavelength instruction containing a plurality of consecutive pulses that instructs the target wavelength to coincide with a first wavelength and a wavelength instruction containing a plurality of consecutive pulses that instructs the target wavelength to coincide with a second wavelength to a rectangular-wave wavelength instruction.

17. The laser apparatus according to claim 12, wherein the processor is configured to change the target wavelength in a form of a triangular or sinusoidal wave on a pulse basis.

18. The laser apparatus according to claim 12, wherein the processor is configured to calculate a correction value used to correct the drive instruction that drives the second driving mechanism based on a difference between the drive instruction value by which the second driving mechanism is driven immediately after the wavelength is changed and the drive instruction value immediately before the wavelength is changed next time, and when the wavelength is changed by using the same drive pattern used for the wavelength change in which the correction value is determined, the drive instruction that drives the second driving mechanism is corrected by using the correction value.

19. The laser apparatus according to claim 12, wherein let p be an integer greater than or equal to one, and the processor is configured to store the measured value corresponding to the target wavelength of a p-th pulse of first burst pulses, and the processor corrects the drive instruction that drives the second driving mechanism for the p-th pulse of subsequent second burst pulses based on a relationship between the target wavelength and the measured value of the stored p-th pulse.

20. A method for manufacturing electronic devices, the method comprising:

generating laser light by a laser apparatus including an oscillator configured to output pulse laser light, a first optical element disposed in an optical path of the pulse laser light, a first rotary stage configured to support the first optical element, a second optical element disposed in the optical path of the pulse laser light, a second rotary stage configured to support the second optical element, a grating on which the pulse laser light is incident via the first and second optical elements and which is disposed so as to cause diffracted light having a wavelength according to an angle of incidence of the pulse laser light to return to the oscillator, a first driving mechanism configured to change the angle of incidence of the pulse laser light to be incident on the grating by driving the first rotary stage to rotate the first optical element, a second driving mechanism configured to change the angle of incidence of the pulse laser light to be incident on the grating by driving the second rotary stage by a smaller amount than an amount driven by the first driving mechanism to rotate the second optical element, a wavelength monitor configured to measure a center wavelength of the pulse laser light, and a processor configured to cyclically change a target wavelength of the pulse laser light and control the center wavelength to coincide with the target wavelength by outputting a drive instruction to the second driving mechanism to change the angle of incidence based on the target wavelength and a value measured by the wavelength monitor, the processor configured to calculate a moving average of drive instruction values by which the second driving mechanism is driven over a segment that is an integer multiple of a wavelength instruction cycle in which the target wavelength is cyclically changed, the processor further configured, when the calculated moving average exceeds a threshold, to cause the second driving mechanism to return to an initial position, and drive the first driving mechanism to cancel a change in the angle of incidence caused by the return of the second driving mechanism to the initial position;

outputting the laser light to an exposure apparatus; and exposing a photosensitive substrate to the laser light in the exposure apparatus to manufacture electronic devices.

* * * * *